US012635529B2

(12) United States Patent　　　　(10) Patent No.:　US 12,635,529 B2
Hashinaga　　　　　　　　　　　　(45) Date of Patent:　May 19, 2026

(54) METHOD OF MANUFACTURING HIGH-FREQUENCY DEVICE

(71) Applicant: Sumitomo Electric Industries, Ltd., Osaka (JP)

(72) Inventor: Tatsuya Hashinaga, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 633 days.

(21) Appl. No.: 18/095,571

(22) Filed: Jan. 11, 2023

(65) Prior Publication Data

US 2023/0290750 A1　　Sep. 14, 2023

(30) Foreign Application Priority Data

Mar. 14, 2022　(JP) ................................. 2022-038783

(51) Int. Cl.
　*H10W 44/20*　　(2026.01)
　*H10W 72/00*　　(2026.01)
　*H10W 90/00*　　(2026.01)
　*H10W 70/00*　　(2026.01)
　*H10W 70/05*　　(2026.01)
　*H10W 70/40*　　(2026.01)
　*H10W 70/60*　　(2026.01)
　　　　　　　(Continued)

(52) U.S. Cl.
　CPC ....... *H10W 44/20* (2026.01); *H10W 72/0198* (2026.01); *H10W 90/00* (2026.01); *H10W 44/216* (2026.01); *H10W 44/241* (2026.01); *H10W 70/093* (2026.01); *H10W 70/099* (2026.01); *H10W 70/417* (2026.01); *H10W 70/457* (2026.01); *H10W 70/60* (2026.01);

*H10W 70/6528* (2026.01); *H10W 72/073* (2026.01); *H10W 72/07331* (2026.01); *H10W 72/325* (2026.01); *H10W 72/352* (2026.01); *H10W 72/874* (2026.01); *H10W 90/10* (2026.01); *H10W 90/736* (2026.01)

(58) Field of Classification Search
　CPC .................. H01L 23/66; H01L 2223/66–6694
　See application file for complete search history.

(56) References Cited

U.S. PATENT DOCUMENTS

2011/0175213 A1* 7/2011 Mori ..................... H01L 23/552
　　　　　　　　　　　　　　　　　　　　257/E23.033
2013/0069219 A1　3/2013　Uchiyama
　　　　　　　　　(Continued)

FOREIGN PATENT DOCUMENTS

JP　　2001-196865 A　　7/2001
JP　　2013069807 A　　4/2013
　　　　　　　(Continued)

OTHER PUBLICATIONS

Extended European Search Report issued on Oct. 10, 2023 for European Patent Application No. 23150937.3.

*Primary Examiner* — Tucker J Wright

(74) *Attorney, Agent, or Firm* — Volpe Koenig

(57) ABSTRACT

A method of manufacturing a high-frequency device includes mounting a first chip having a first pillar on an upper surface thereof on a metal base, forming an insulator layer covering the first chip on the metal base, exposing an upper surface of the first pillar from the insulator layer, and forming a first wiring connected to the first pillar on the insulator layer and transmitting a high-frequency signal.

9 Claims, 25 Drawing Sheets

100

(51) Int. Cl.
       *H10W 70/652*       (2026.01)
       *H10W 72/30*        (2026.01)
       *H10W 90/10*        (2026.01)

(56)                 References Cited

U.S. PATENT DOCUMENTS

2018/0047673  A1    2/2018  Gu et al.
2020/0053883  A1    2/2020  Inoue

FOREIGN PATENT DOCUMENTS

JP        2019-176149  A    10/2019
JP        2019528568   A    10/2019
WO        2010041630   A1    4/2010
WO        2018/031191  A1    2/2018

* cited by examiner

METHOD OF MANUFACTURING HIGH-FREQUENCY DEVICE

CROSS REFERENCE TO RELATED APPLICATIONS

This application claims priority based on Japanese Patent Application No. 2022-038783, filed on Mar. 14, 2022, and the entire contents of the Japanese patent applications are incorporated herein by reference.

FIELD

The present disclosure relates to a method of manufacturing a high-frequency device.

BACKGROUND

There is known a semiconductor device in which a semiconductor chip is mounted face-up on a metal base in a package including the metal base and an insulating frame provided on the metal base, and the semiconductor chip is electrically connected to a pattern on the insulating frame using a bonding wire (for example, Patent Document 1: Japanese Patent Application Laid-Open No. 2019-176149, and Patent Document 2: Japanese Patent Application Laid-Open No. 2001-196865).

SUMMARY

A method of manufacturing a high-frequency device according to the present disclosure includes: mounting a first chip having a first pillar on an upper surface thereof on a metal base; forming an insulator layer covering the first chip on the metal base; exposing an upper surface of the first pillar from the insulator layer; and forming a first wiring connected to the first pillar on the insulator layer and transmitting a high-frequency signal.

DETAILED DESCRIPTION OF EMBODIMENTS

Figure 1:
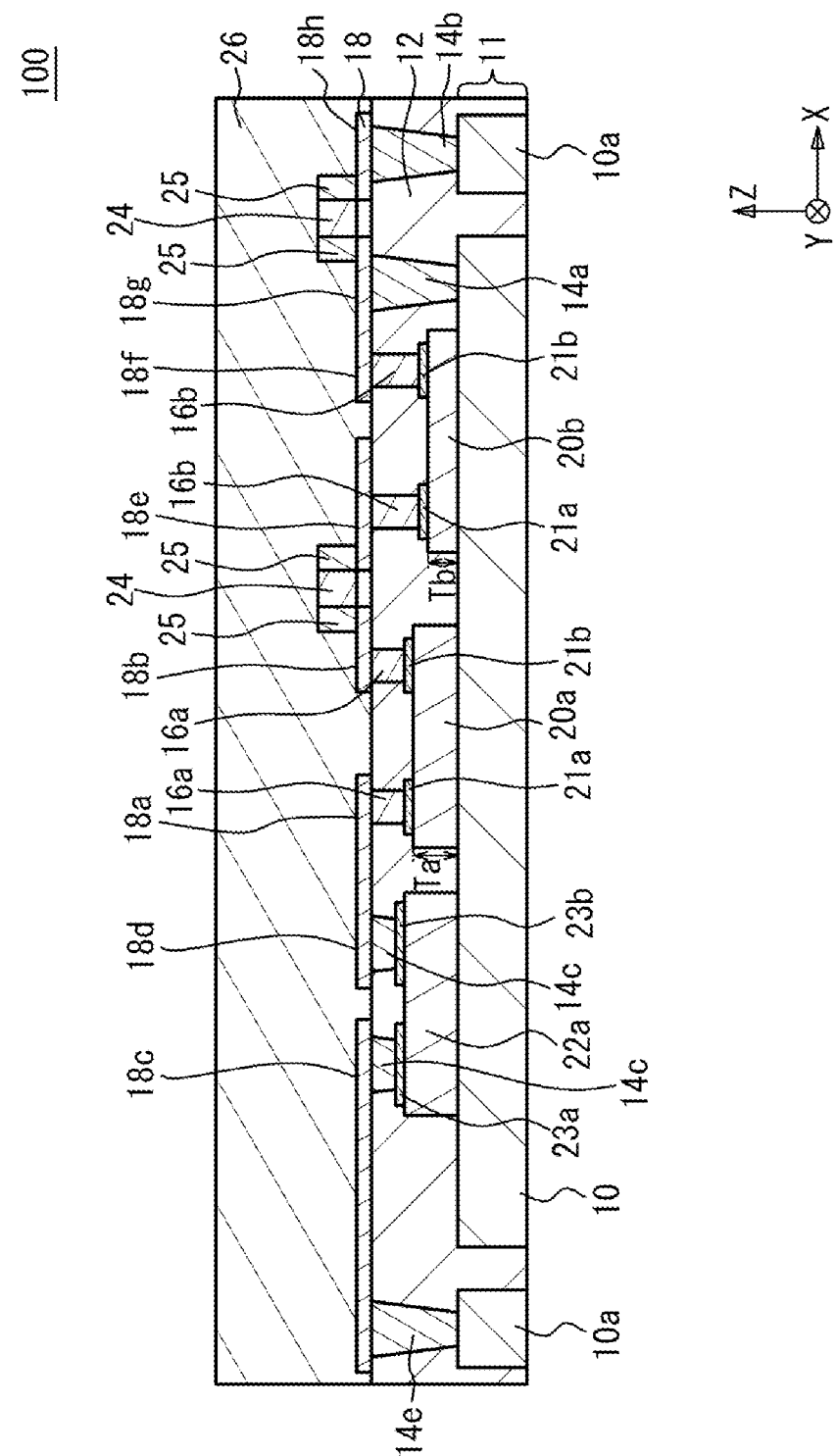
FIG. 1 is a cross-sectional view of a high-frequency device according to a first embodiment.

In Patent Document 1, high-frequency characteristics are deteriorated because a high-frequency signal is transmitted through the bonding wire. It is considered that a microstrip line is used as a transmission line. However, when the alignment accuracy between the chip and the line is poor, the sizes of electrodes on the chip are increased and the cost of the chip is increased.

The present disclosure has been made in view of the above problems, and an object of the present disclosure is to provide a method of manufacturing a high-frequency device capable of reducing costs.

DESCRIPTION OF EMBODIMENTS OF THE PRESENT DISCLOSURE

First, the contents of the embodiments of this disclosure are listed and explained.

(1) A method of manufacturing a high-frequency device according to the present disclosure includes: mounting a first chip having a first pillar on an upper surface thereof on a metal base; forming an insulator layer covering the first chip on the metal base; exposing an upper surface of the first pillar from the insulator layer; and forming a first wiring connected to the first pillar on the insulator layer and transmitting a high-frequency signal. Thus, it is possible to provide the method for manufacturing the high-frequency device capable of reducing a cost.

(2) The method of manufacturing the high-frequency device may further include: mounting a second chip on the metal base; forming a first through hole reaching an upper surface of the second chip in the insulator layer; forming a first through electrode connected to an upper surface of the second chip in the first through hole; and forming a second wiring connected to the first through electrode on the insulator layer. The forming the insulator layer may include forming the insulator layer covering the first chip and the second chip.

(3) The second chip may be a passive element including a dielectric substrate and an electrode provided on an upper surface of the dielectric substrate.

(4) The first chip may include a transistor.

(5) The passive element may be at least a part of a matching circuit connected to the transistor.

(6) The first chip may include a first electrode to which the first pillar is bonded, the second chip may include a second electrode to which the first through electrode is bonded, and a width of the second electrode may be larger than that of the first electrode.

(7) The forming the first through hole may include forming the first through hole by irradiating the insulating layer with a laser beam.

(8) The method of manufacturing the high-frequency device may further include: mounting a third chip having a second pillar on an upper surface thereof on the metal base; and forming a third wiring connected to the second pillar on the insulator layer. The forming the insulator layer may include forming the insulator layer covering the first chip and the third chip, and the exposing the upper surface of the first pillar from the insulator layer may include exposing the upper surfaces of the first pillar and the second pillar from the upper surface of the insulator layer by polishing or grinding the insulator layer covering the first pillar and the second pillar.

(9) The method of manufacturing the high-frequency device may further include: forming a second through hole reaching an upper surface of the metal base in the insulator layer; forming a second through electrode connected to the upper surface of the metal base in the second through hole; and forming a fourth wiring connected to the second through electrode on the insulator layer.

(10) The method of manufacturing the high-frequency device may further include mounting an electronic component on a metal layer provided on the insulator layer.

DETAILS OF EMBODIMENTS OF THE PRESENT DISCLOSURE

Specific examples of a high frequency circuit in accordance with embodiments of the present disclosure are described below with reference to the drawings. The present disclosure is not limited to these examples, but is indicated by the claims, which are intended to include all modifications within the meaning and scope of the claims.

First Embodiment

FIG. 1 is a cross-sectional view of a high-frequency device according to a first embodiment. As illustrated in FIG. 1, in a high-frequency device 100, a lead frame 11 includes a metal base 10 and a terminal 10a separated from each other. The lead frame 11 is composed of copper as a main component, for example, and is provided with a silver film. Chips 20a, 20b and 22a are mounted on the metal base 10. The chips 20a and 20b are semiconductor chips, for example, and transistors are formed thereon. The chip 22a is, for example, a passive element, in which a capacitor, a line and the like are formed. A thickness Ta of the chip 20a is larger than a thickness Tb of the chip 20b. Electrodes 21a and 21b are provided on an upper surface of each of the chips 20a and 20b. Electrodes 23a and 23b are provided on an upper surface of the chip 22a. The electrodes 21a, 21b, 23a and 23b are metal layers such as a gold layer, for example. An insulator layer 12 is provided on the lead frame 11 so as to cover the chips 20a, 20b and 22a. The insulator layer 12 is a resin layer such as an epoxy resin. A metal layer 18 is provided on the insulator layer 12. The metal layer 18 forms wirings 18a to 18h as a rewiring layer. The metal layer 18 is, for example, a gold layer or a copper layer. A wiring for transmitting a high-frequency signal among the wirings 18a to 18h forms a microstrip line along with the metal base 10.

Through electrodes 14a to 14c and 14e and pillars 16a and 16b are provided through the insulator layer 12. The through electrode 14a electrically connects and short-circuits a wiring 18g and the metal base 10. The through electrode 14b electrically connects and short-circuits the wiring 18h and the terminal 10a. The through electrodes 14c electrically connect and short-circuit wirings 18c and 18d and the electrodes 23a and 23b of the chip 22a, respectively. The through electrode 14e electrically connects and short-circuits the wiring 18c and the terminal 10a. The through electrodes 14a to 14c and 14e are, for example, a gold layer or a copper layer. The pillars 16a electrically connect and short-circuit the wirings 18a and 18b and the electrodes 21a and 21b of the chip 20a, respectively. The pillars 16b electrically connect and short-circuit wirings 18e and 18f and the electrodes 21a and 21b of the chip 20b, respectively. The pillars 16a and 16b are, for example, a gold layer or a copper layer. The width of each of the pillars 16a and 16b is less than the width of each of the through electrodes 14a to 14c and 14e.

Electronic components 24 are mounted on the insulator layer 12. Each electrode 25 of the electronic components 24 is bonded to the metal layer 18. A solder such as SnAgCu is used for bonding the electrode 25 and the metal layer 18. The electronic component 24 is, for example, a discrete component, and includes a chip resistor, a chip capacitor, and a chip inductor. An insulator layer 26 is provided on the insulator layer 12 so as to cover the electronic component 24. The insulator layer 26 is a resin layer such as an epoxy resin. The lead frame 11 has a thickness of, for example, 200 the insulator layer 12 has a thickness of, for example, 200 and the insulator layer 26 has a thickness of, for example, 400 μm.

Figure 2:
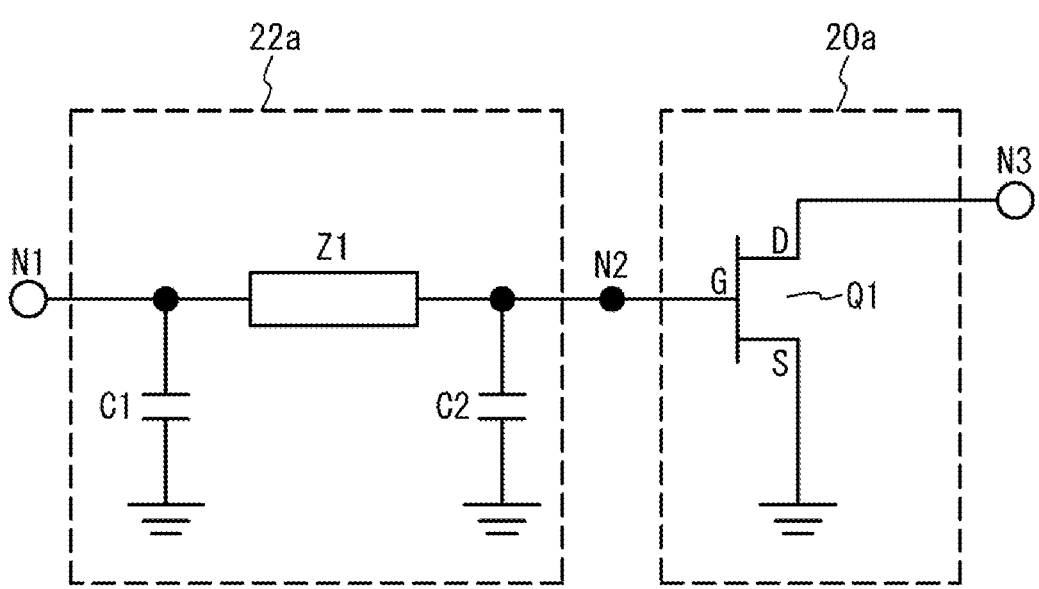
FIG. 2 is a circuit diagram of the vicinity of chips 22a and 20a according to the first embodiment.

FIG. 2 is a circuit diagram of the vicinity of the chips 22a and 20a according to the first embodiment. As illustrated in FIG. 2, in the chip 22a, a transmission line Z1 is connected between nodes N1 and N2. A capacitor C1 is shunt-connected to a node provided on the node N1 side of the transmission line Z1, and a capacitor C2 is shunt-connected to a node provided on the node N2 side of the transmission line Z1. The chip 22a functions as a CLC π-type circuit. A transistor Q1 is provided in the chip 20a. The transistor Q1 is, for example, an FET (Field Effect Transistor). A source S is grounded, a gate G is connected to the node N2, and a drain D is connected to the node N3. The chip 22a functions as a matching circuit for matching an impedance seen from the node N1 to the chip 22a and an impedance seen from the node N2 to the gate G. The transistor Q1 amplifies a high-frequency signal input to the node N1 and outputs the amplified high-frequency signal to the drain D.

Figure 3:
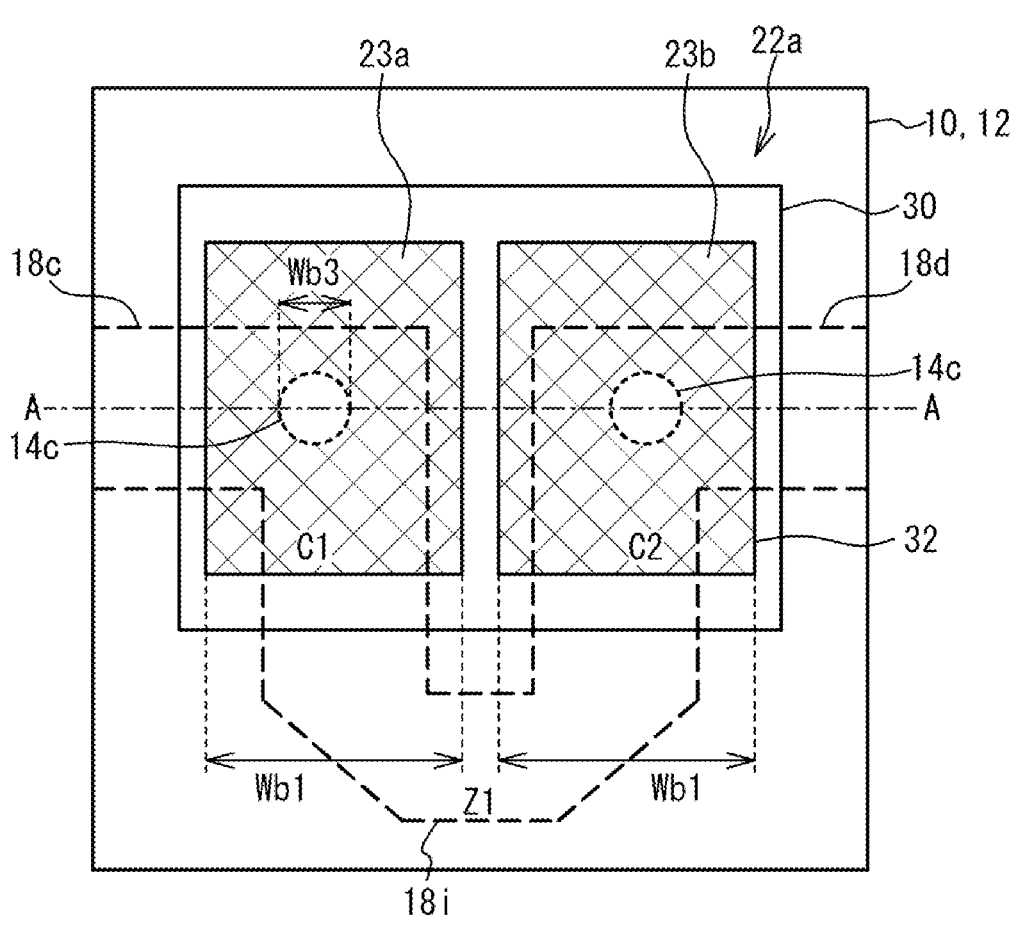
FIG. 3 is a plan view of the vicinity of the chip 22a according to the first embodiment.
Figure 3:
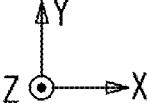
Figure 4:
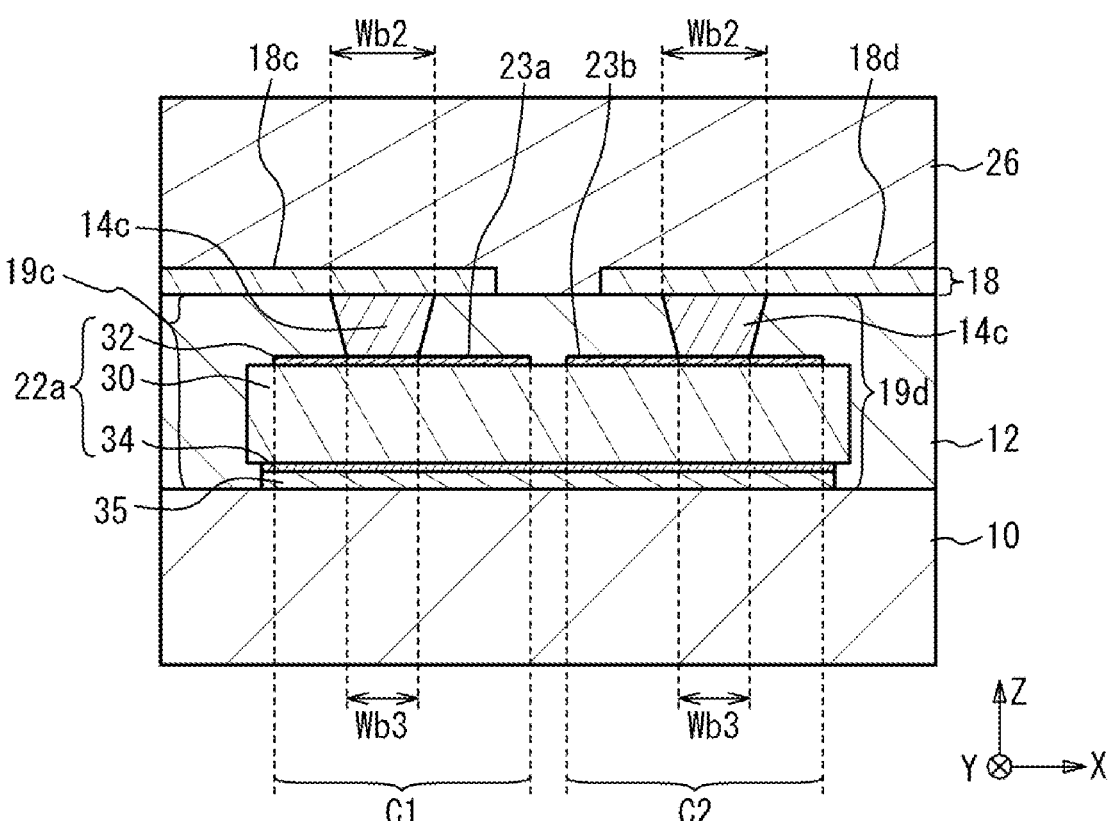
FIG. 4 is a cross-sectional view taken along line A-A of FIG. 3.

FIG. 3 is a plan view of the vicinity of the chip 22a according to the first embodiment viewed from an upper side to a lower side along a Z direction. FIG. 4 is a cross-sectional view taken along line A-A of FIG. 3. In FIG. 3, the metal layer 32 is illustrated by cross hatching, and each through electrode 14c on a surface where the through electrode 14c is bonded to the metal layer 32 is illustrated by a circle of a dot line. As illustrated in FIGS. 3 and 4, the chip 22a is mounted on the metal base 10. The chip 22a includes a dielectric substrate 30 and metal layers 32 and 34. The metal layer 32 forms the electrodes 23a and 23b. The electrodes 23a and 23b are separated from each other on an upper surface of the dielectric substrate 30. A metal layer 34 is provided on a lower surface of the dielectric substrate 30. The metal layer 34 is provided almost entirely on the lower surface of the dielectric substrate 30. The dielectric substrate 30 is, for example, a ceramic substrate. The dielectric substrate 30 has a relative dielectric constant of, for example, 5 to 200, which is higher than the relative dielectric constant of the insulator layers 12 and 26. Among a laminated body 20c composed of the metal layer 34, the dielectric substrate 30 and the metal layer 32, a region overlapping the electrode 23a when viewed from the upper side to the lower side along the Z direction constitutes a capacitor C1. A region overlapping the electrode 23b as viewed from the upper side to the lower side along the Z direction constitutes a capacitor C2. By increasing a dielectric constant of the dielectric substrate 30, the areas of the electrodes 23a and 23b can be reduced, and the capacitors C1 and C2 can be reduced in size, so that the chip 22a can be reduced in size. In addition, at least a part of the line 18i forming the transmission line Z1 overlaps the dielectric substrate 30 when viewed from the Z direction, so that the line 18i can be made smaller and the chip 22a can be made smaller. The metal layer 34 and the metal base 10 are bonded by a bonding material 35. The bonding material 35 is a material obtained by sintering a metal paste such as a silver paste.

The insulator layer 12 is provided on the metal base 10 so as to cover the chip 22a. The through electrodes 14c are provided so as to penetrate through the insulator layer 12. The through electrodes 14c are provided on the electrodes 23a and 23b. The metal layer 18 is provided on the insulator layer 12. The metal layer 18 forms the wirings 18c and 18d and the line 18i. The wiring 18c and the line 18i are electrically connected to the electrode 23a via the through electrode 14c. The wiring 18d and the line 18i are electrically connected to the electrode 23b via the through electrode 14c. The insulator layer 26 is provided on the insulator layer 12 so as to cover the metal layer 18.

The electrode 23a and the metal layer 34 sandwiching the dielectric substrate 30 form the capacitor C1, and the electrode 23b and the metal layer 34 sandwiching the dielectric substrate 30 form the capacitor C2. A reference potential such as a ground potential is supplied to the metal base 10. As a result, the metal layer 34 has the ground potential. The line 18i, the metal layer 34 and the metal base 10 form the transmission line Z1 as the microstrip line. The wirings 18c and 18d and the metal base 10 form microstrip lines 19c and 19d, respectively. A width Wb1 of each of the electrodes 23a and 23b is, for example, 150 μm or more. The cross-sectional shape of the through electrode 14c is trapezoidal, and widths Wb3 of the through electrodes 14c in contact with the electrodes 23a and 23b are smaller than widths Wb2 of the through electrodes 14c in contact with the wirings 18c and 18d. The widths Wb3 are, for example, 100 to 120 μm, and the widths Wb2 are, for example, 130 to 150 μm.

Figure 5:
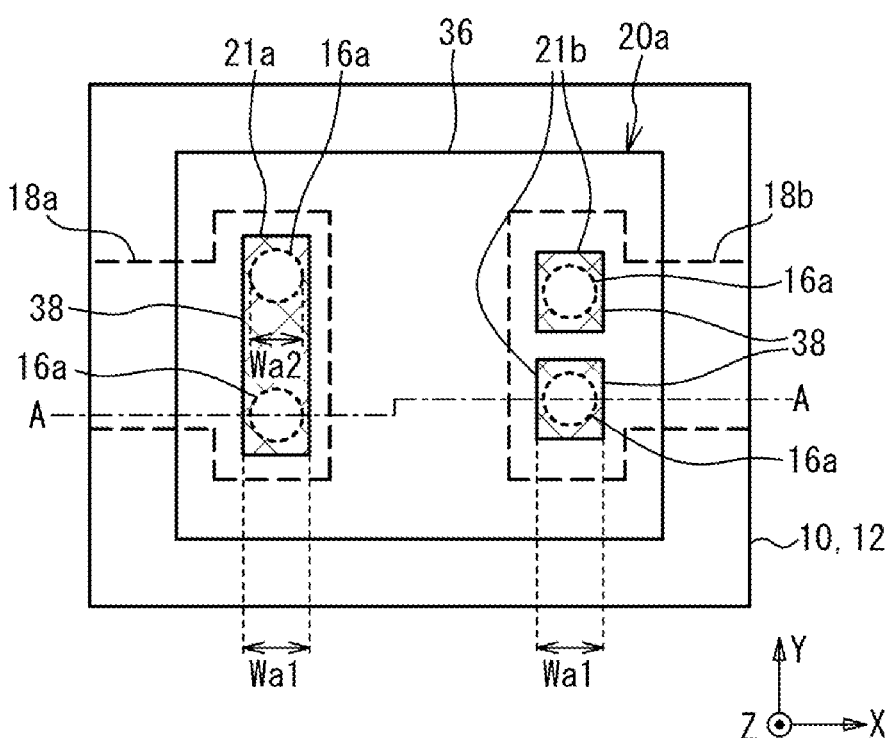
FIG. 5 is a plan view of the vicinity of the chip 20a according to the first embodiment.
Figure 6:
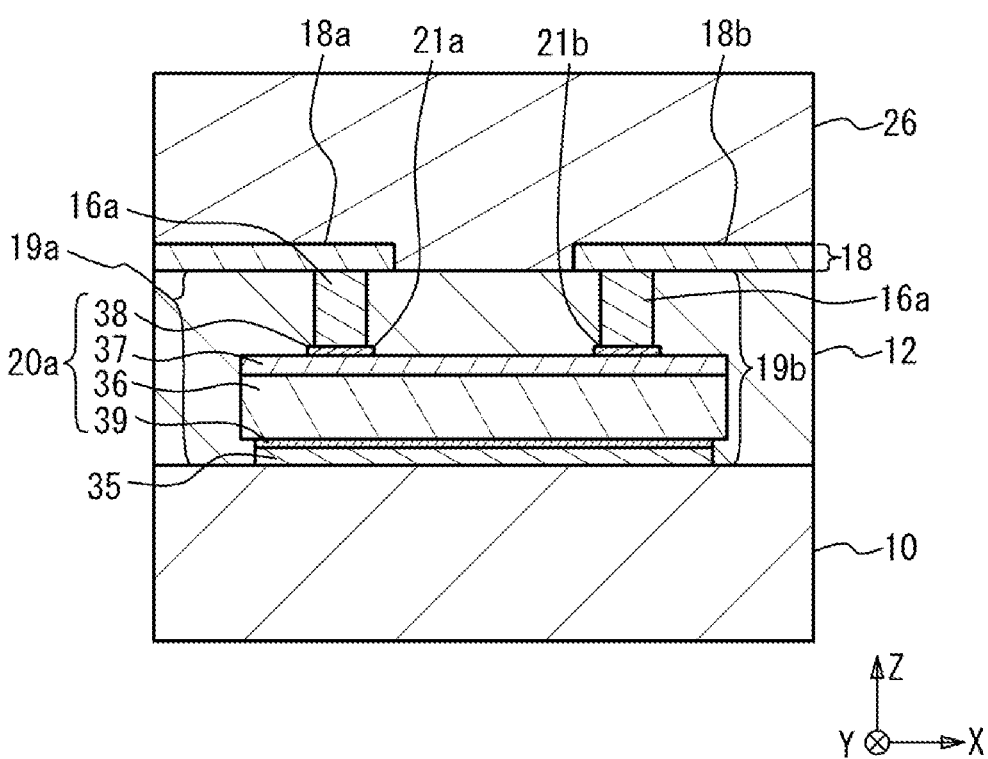
FIG. 6 is a cross-sectional view taken along line A-A of FIG. 5.

FIG. 5 is a plan view of the vicinity of the chip 20a according to the first embodiment viewed from the upper side to the lower side along the Z direction. FIG. 6 is a cross-sectional view taken along line A-A of FIG. 5. In FIG. 5, a metal layer 38 is illustrated by cross hatching, and each pillar 16a on a surface where the pillar 16a is bonded to the metal layer 38 are illustrated by a circle of a dot line. As illustrated in FIGS. 5 and 6, the chip 20a is mounted on the metal base 10. In the chip 20a, a semiconductor layer 37 is provided on a substrate 36. When the transistor provided in the chip 20a is a GaN HEMT (Gallium Nitride High Electron Mobility Transistor), the substrate 36 is, for example, a SiC substrate, a sapphire substrate or the like. The semiconductor layer 37 includes a GaN channel layer and an AlGaN barrier layer. The metal layer 38 is provided on an upper surface of the semiconductor layer 37, and a metal layer 39 is provided on a lower surface of the substrate 36. The metal layer 38 forms the electrodes 21a and 21b. The electrodes 21a and 21b are, for example, a source electrode and a drain electrode. The metal layer 39 is electrically connected to, for example, the source electrode. The metal layer 39 is bonded to the metal base 10 via the bonding material 35. The bonding material 35 is, for example, a sintered metal paste.

The insulator layer 12 is provided so as to cover the chip 20a. The metal layer 18 is provided on an upper surface of the insulator layer 12. The metal layer 18 forms the wirings 18a and 18b. The wirings 18a and 18b and the metal base 10 form microstrip lines 19a and 19b, respectively. The insulator layer 26 is provided on the insulator layer 12 so as to cover the metal layer 18. The wirings 18a and 18b are electrically connected to the electrodes 21a and 21b via the pillars 16a, respectively. The pillars 16a may be formed on the electrodes 21a and 21b by a plating method. The pillars 16a may be formed on the electrodes 21a and 21b by using a stud bump method. Widths Wa1 of the electrodes 21a and 21b are, for example, 100 μm, and widths Wa2 of the pillars 16a are, for example, 70 μm.

As illustrated in FIGS. 3 to 6, since the microstrip lines 19a to 19d can be formed by the wirings 18a to 18d connected to the chips 20a and 22a, the high-frequency characteristics can be improved compared with the use of the bonding wires as described in Patent Document 1.

Manufacturing Method of First Embodiment

Figure 7A:
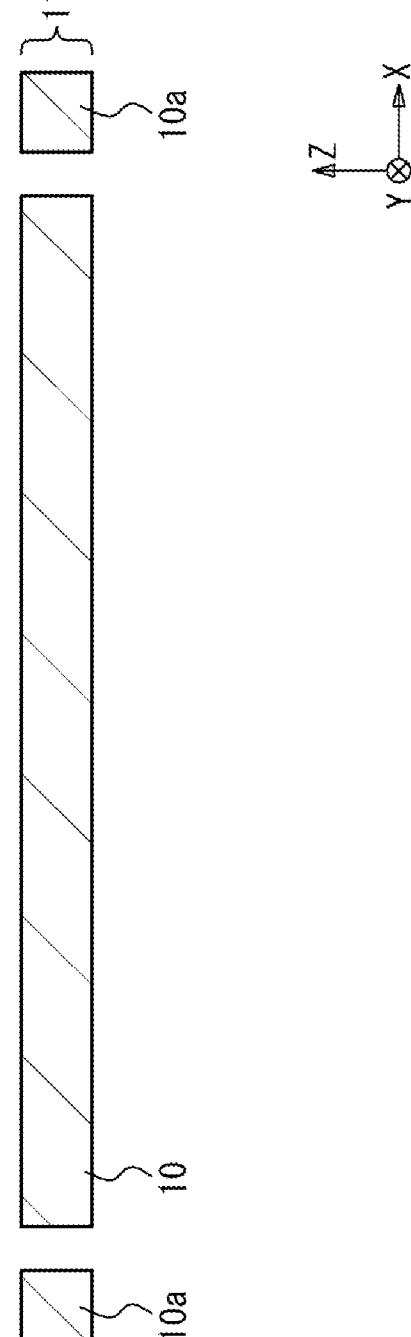
FIG. 7A is a cross-sectional view illustrating a method of manufacturing the high-frequency device according to the first embodiment.

FIGS. 7A to 10B are cross-sectional views illustrating a method of manufacturing the high-frequency device according to the first embodiment. As illustrated in FIG. 7A, the lead frame 11 is prepared. The size of the lead frame 11 is, for example, 500 mm×500 mm. As illustrated in FIG. 7B, the chips 20a, 20b and 22a are mounted on the metal base 10. The pillars 16a and 16b are provided on the electrodes 21a and 21b of the chips 20a and 20b. No pillar is provided on the electrodes 23a and 23b of the chip 22a. A bonding material which is a metal paste such as, for example, nano-silver paste is partially coated on the metal base 10. Thereafter, the chips 20a, 20b and 22a are mounted on the bonding material and subjected to heat treatment. The bonding material is sintered by heat treatment. Thus, the chips 20a, 20b and 22a are mounted on the metal base 10. Since the chip 20a is thicker than 20b, the upper surfaces of the pillars 16a are positioned on the +Z side along the Z direction from the upper surface of the pillar 16b.

Figure 8A:
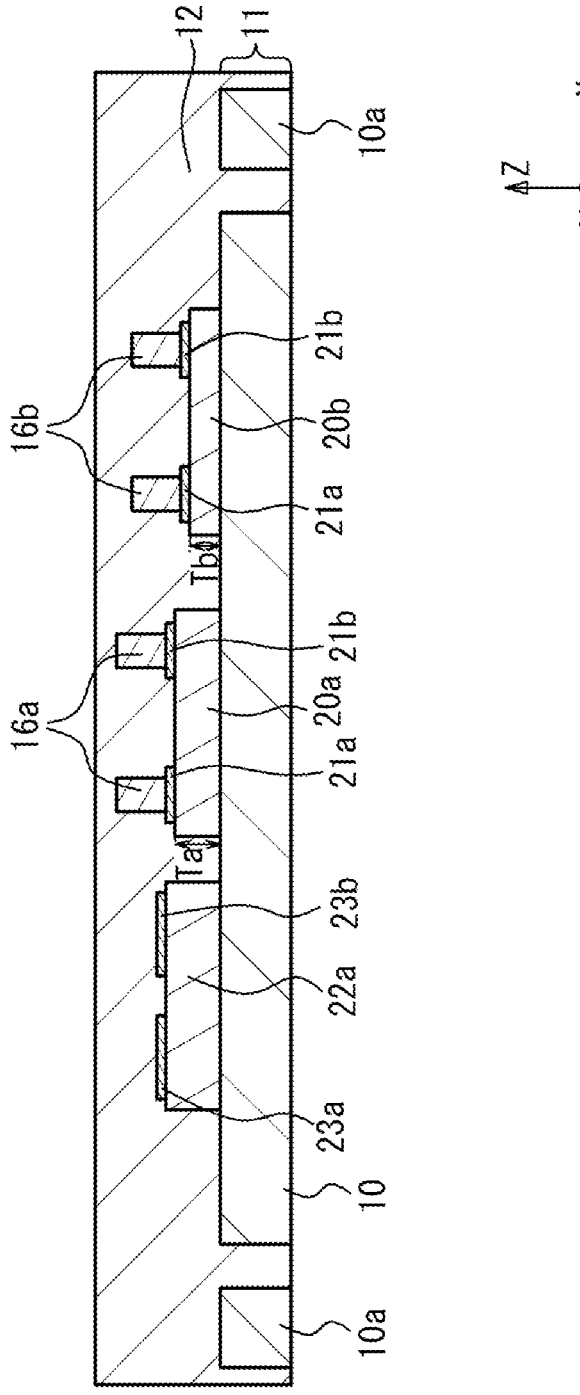
FIG. 8A is a cross-sectional view illustrating a method of manufacturing the high-frequency device according to the first embodiment.

As illustrated in FIG. 8A, the insulator layer 12 is formed on the lead frame 11 so as to cover the chips 20a, 20b and 22a. For example, a resin film is adhered to the lead frame 11 by using a vacuum laminator, and the insulation layer 12 is cured by heat treatment. Thus, the insulator layer 12 is formed. The insulator layer 12 may be formed by applying a softened resin on the lead frame 11 and curing the resin by heat treatment, as in the case of molding. The insulator layer 12 is formed so as to cover the pillars 16a and 16b.

Figure 8B:
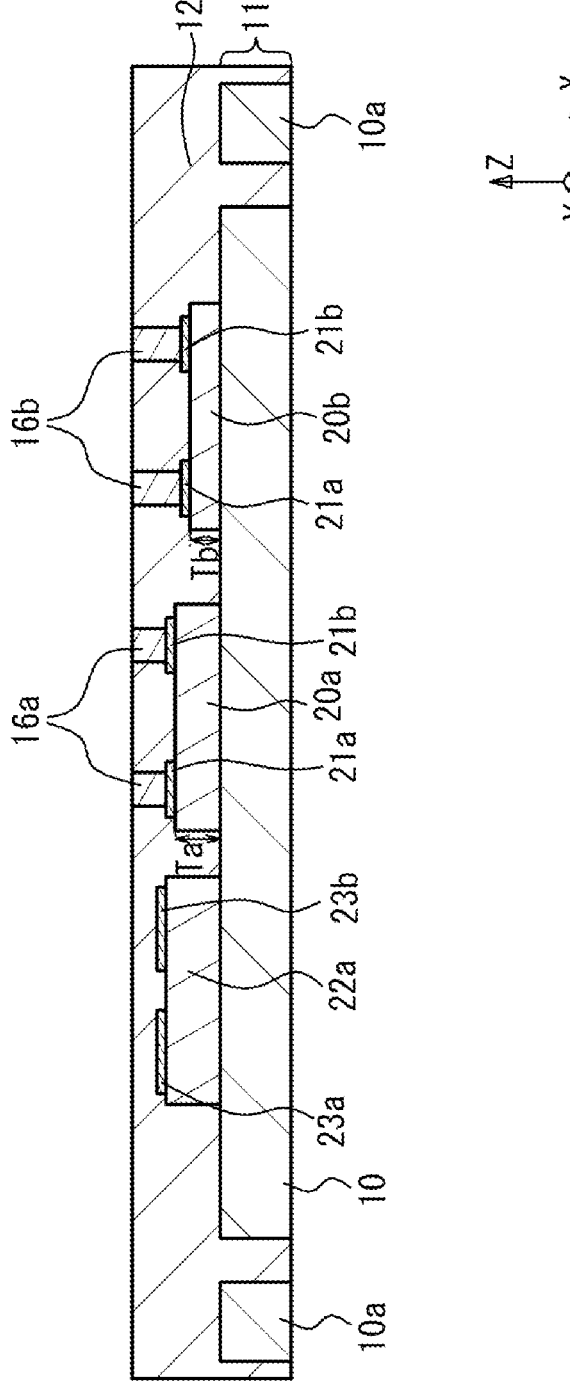
FIG. 8B is a cross-sectional view illustrating a method of manufacturing the high-frequency device according to the first embodiment.

As illustrated in FIG. 8B, the upper surface of the insulator layer 12 is polished or ground. Thus, the upper surfaces of the pillars 16a and 16b are exposed from the upper surface of the insulator layer 12. The upper surfaces of the insulator layer 12 and the pillars 16a and 16b are substantially flush with each other.

Figure 9A:
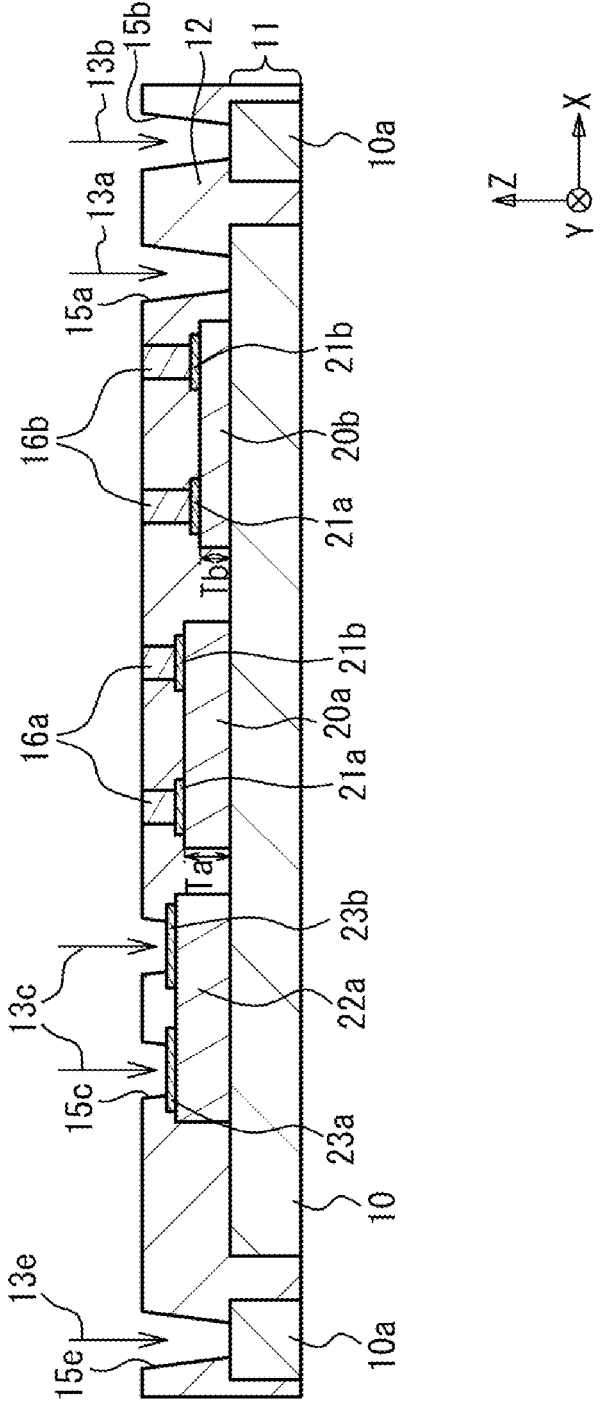
FIG. 9A is a cross-sectional view illustrating a method of manufacturing the high-frequency device according to the first embodiment.

As illustrated in FIG. 9A, through holes 15a to 15c and 15e penetrating through the insulator layer 12 are formed. The through holes 15a to 15c and 15e are formed by irradiating the insulating layer 12 with laser beams 13a to 13c and 13e, respectively. The laser beams 13a to 13c and 13e, for example, ultraviolet light, visible light or infrared light. For example, an ultraviolet laser device or a carbon dioxide laser device using a harmonic of a YAG (Yittrium Aluminum Garnet) laser is used as the laser device. When the through holes 15a, 15b and 15e reaching the upper surface of the lead frame 11 are formed, the power of the laser beams 13a, 13b and 13e is increased. When the through hole 15c reaching the upper surface of the chip 22a is formed, the power of the laser beam 13c is reduced.

Figure 9B:
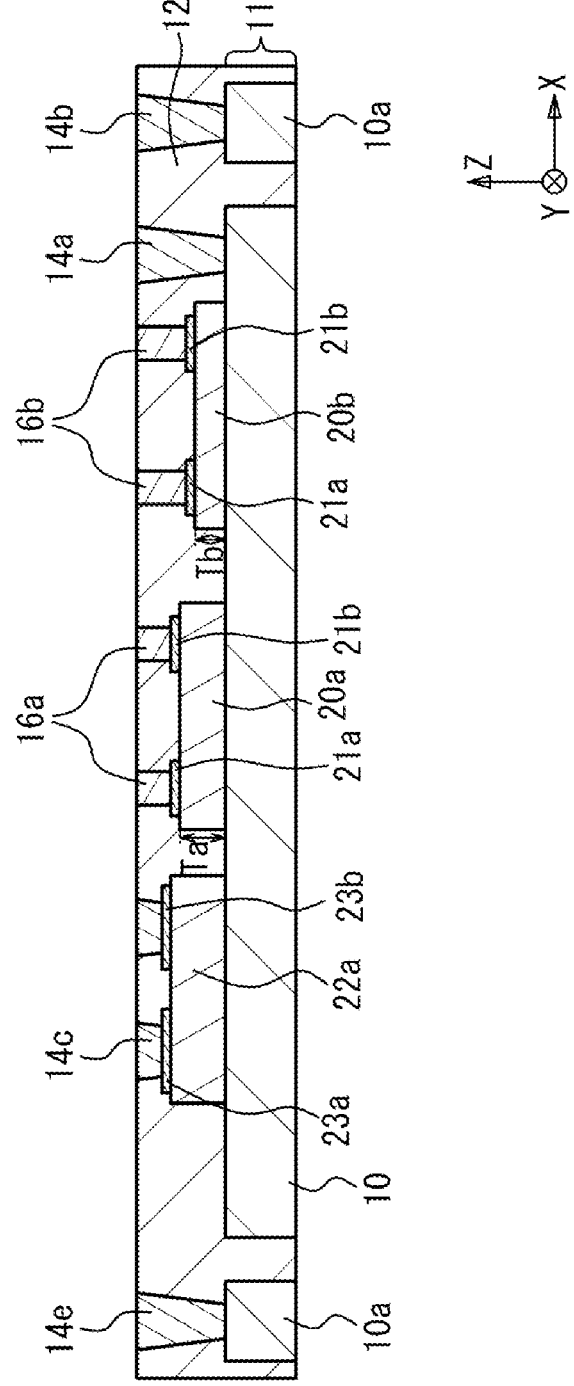
FIG. 9B is a cross-sectional view illustrating a method of manufacturing the high-frequency device according to the first embodiment.

As illustrated in FIG. 9B, the through electrodes 14a to 14c and 14e are formed in the through holes 15a to 15c and 15e, respectively. The through electrodes 14a to 14c and 14e are formed by, for example, a plating method. As the plating method, for example, a seed layer is formed by using an electroless plating method, and a plating layer is formed on the seed layer by using an electrolytic plating method.

Figure 10A:
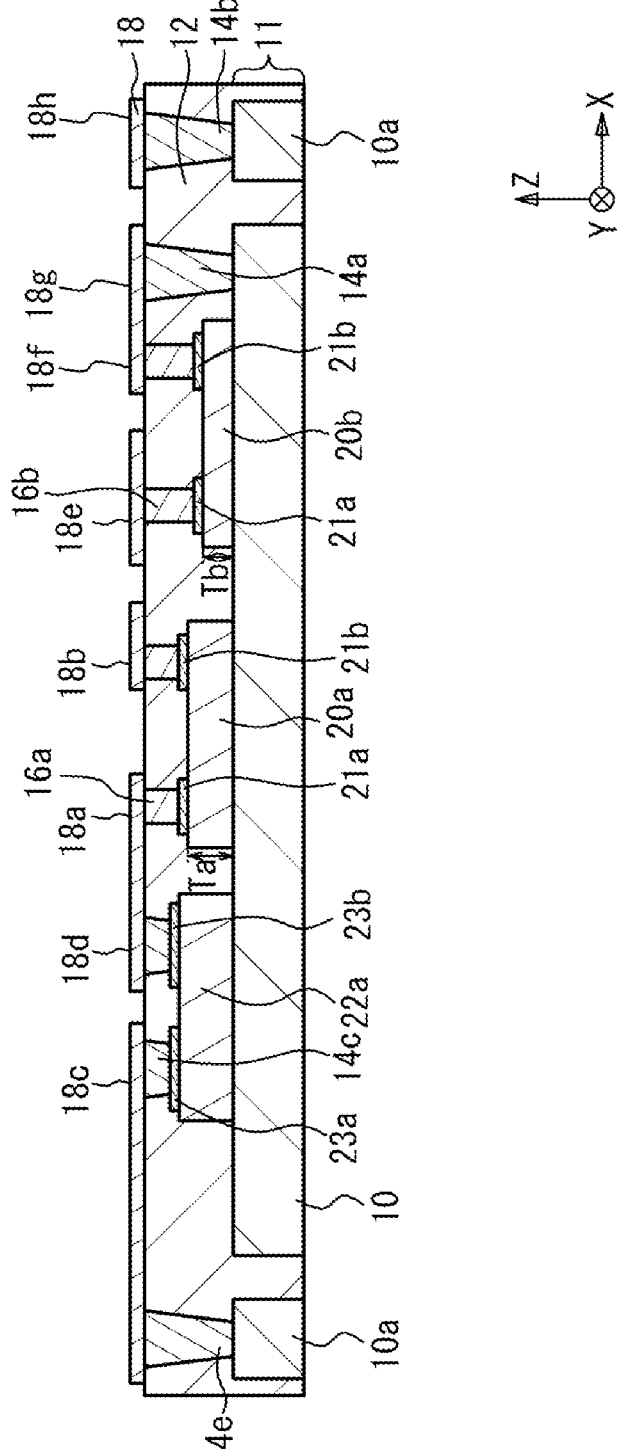
FIG. 10A is a cross-sectional view illustrating a method of manufacturing the high-frequency device according to the first embodiment.

As illustrated in FIG. 10A, the metal layer 18 is formed on the insulator layer 12. The metal layer 18 is formed by, for example, the plating method. Desired region of the metal layer 18 are removed by, for example, an etching method. The wirings 18a to 18h are formed by the metal layer 18. A metal film (for example, a gold film) for improving solder wettability may be formed on the surface of the metal layer 18.

Figure 10B:
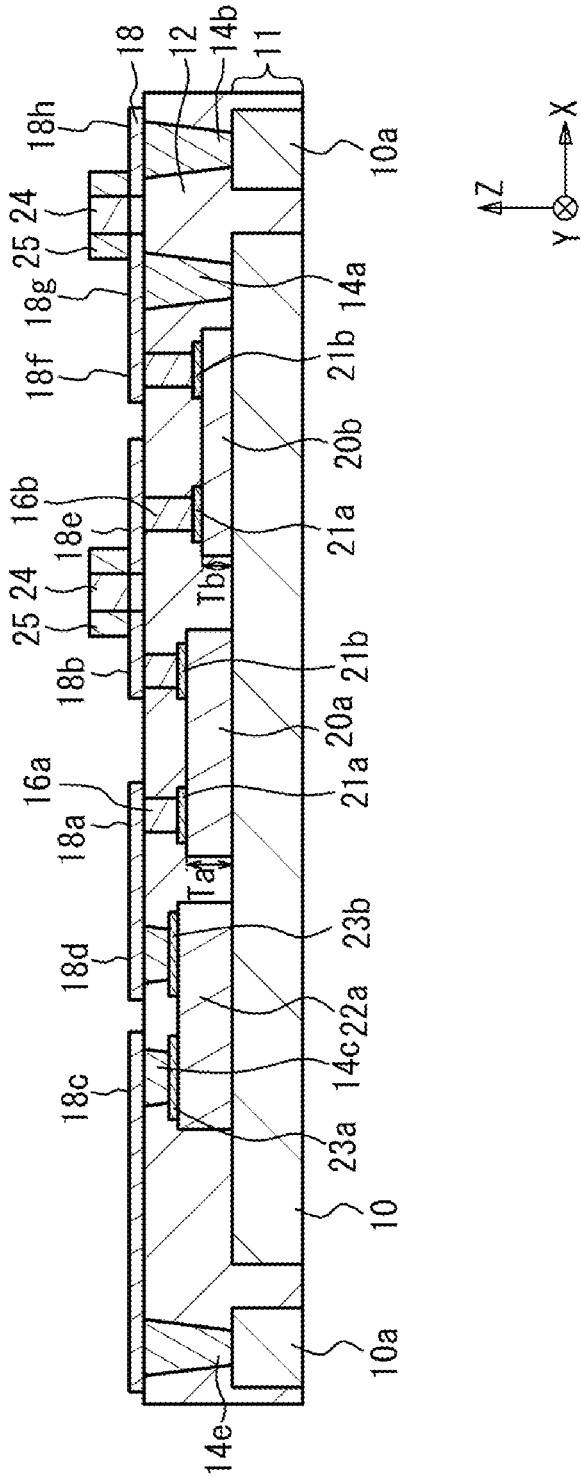
FIG. 10B is a cross-sectional view illustrating a method of manufacturing the high-frequency device according to the first embodiment.

As illustrated in FIG. 10B, the electronic components 24 are mounted on the metal layer 18 using the bonding material. The bonding material bonds the electrodes 25 of the electronic components 24 and the metal layer 18. Thereafter, the insulator layer 26 is formed on the insulator layer 12 so as to cover the metal layer 18 and the electronic components 24. The insulator layer 26 is formed by, for example, a molding method or a lamination method. The lead frame 11 and the insulator layers 12 and 26 are cut into individual pieces. For the cutting, for example, a dicing method using a dicing blade is used. Thus, the high-frequency device according to the first embodiment is completed.

Figure 11:
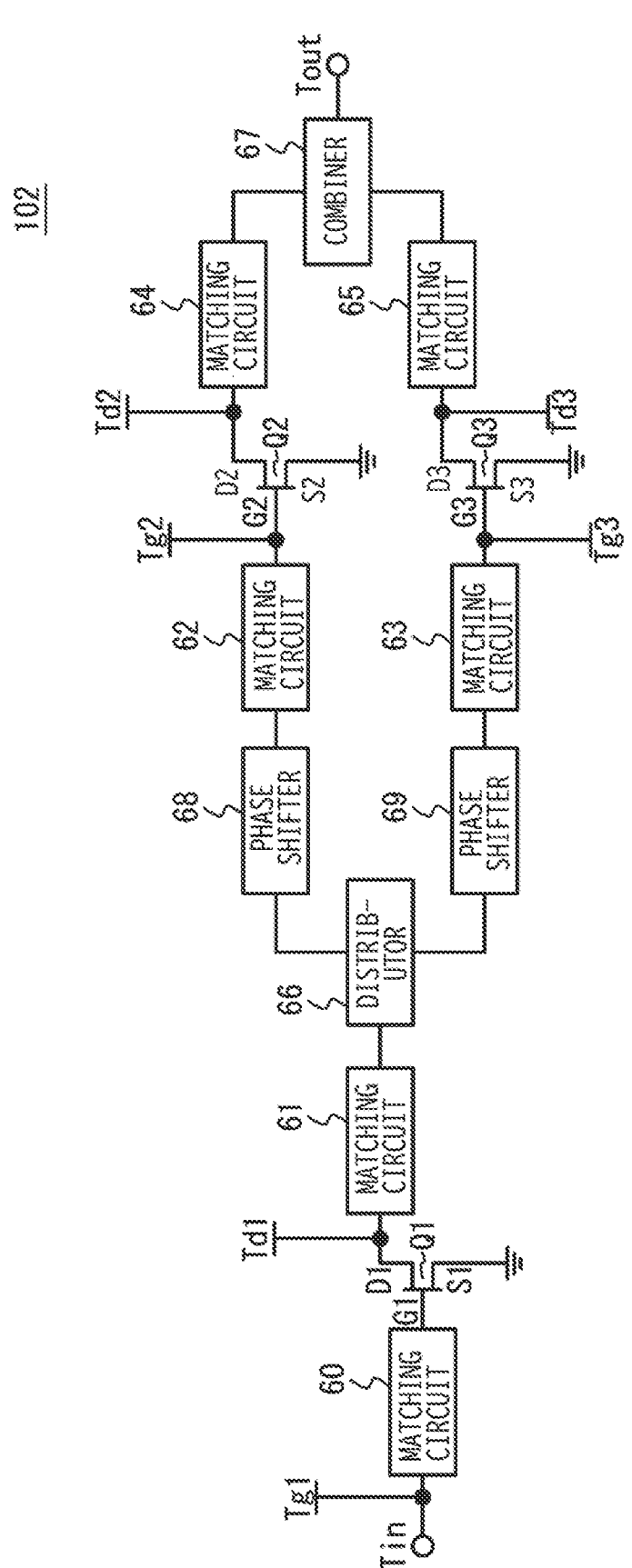
FIG. 11 is a block diagram illustrating an example of an amplifying apparatus according to the first embodiment.

A high-frequency power amplifying apparatus used in a base station for mobile communication will be described as an example of the high-frequency device. FIG. 11 is a block diagram illustrating an example of the amplifying apparatus according to the first embodiment. As illustrated in FIG. 11, an amplifier 102 includes transistors Q1 to Q3. The transistors Q1 to Q3 are FETs, for example. The transistor Q1 is a driver amplifier, and the transistors Q2 and Q3 are a main amplifier and a peak amplifier of a Docherty amplifier, respectively.

An input terminal Tin is connected to a gate G1 of the transistor Q1 via a matching circuit 60. The matching circuit 60 matches an impedance seen from the input terminal Tin to the matching circuit 60 with an impedance seen from the matching circuit 60 to the gate G1. A gate bias voltage is applied to the gate G1 from a bias terminal Tg1. A source S1 of the transistor Q1 is grounded. A drain D1 of the transistor Q1 is connected to a distributor 66 via a matching circuit 61. The matching circuit 61 matches an impedance seen from the drain D1 to the matching circuit 61 with an impedance seen from the matching circuit 61 to the distributor 66. A drain bias voltage is applied to the drain D1 from a bias terminal Td1. The distributor 66 distributes the high-frequency signal output from the matching circuit 61 into two paths.

The distributor 66 is connected to a gate G2 of the transistor Q2 via a phase shifter 68 and a matching circuit 62. The phase shifter 68 shifts the phase of the high-frequency signal output from the distributor 66. The matching circuit 62 matches an impedance seen from the distributor 66 to the matching circuit 62 with an impedance seen from the matching circuit 62 to the gate G2. A gate bias voltage is applied to the gate G2 from a bias terminal Tg2. A source S2 of the transistor Q2 is grounded. A drain D2 of the transistor Q2 is connected to a combiner 67 via a matching circuit 64. The matching circuit 64 matches an impedance seen from the drain D2 to the matching circuit 64 with an impedance seen from the matching circuit 64 to the combiner 67. A drain bias voltage is applied to the drain D2 from a bias terminal Td2.

The distributor 66 is connected to a gate G3 of the transistor Q3 via a phase shifter 69 and a matching circuit 63. The phase shifter 69 shifts the phase of the high-frequency signal output from the distributor 66. The matching circuit 63 matches an impedance seen from the distributor 66 to the matching circuit 63 with an impedance seen from the matching circuit 63 to the gate G3. A gate bias voltage is applied to the gate G3 from a bias terminal Tg3. A source S3 of the transistor Q3 is grounded. A drain D3 of the transistor Q3 is connected to the combiner 67 via a matching circuit 65. The matching circuit 65 matches an impedance seen from the drain D3 to the matching circuit 65 with an impedance seen from the matching circuit 65 to the combiner 67. A drain bias voltage is applied to the drain D3 from a bias terminal Td3.

The combiner 67 combines the high-frequency signal output from the drain D2 and the high-frequency signal output from the drain D3 and outputs the combined high-frequency signal to the output terminal Tout. Bias circuits are provided between the bias terminals Tg1 to Tg3 and Td1 to Td3 and the transistors Q1 to Q3, but their illustration is omitted.

The high-frequency signal input from the input terminal Tin is amplified by the transistor Q1. The transistors Q2 and Q3, the distributor 66 and the combiner 67 form a Docherty amplifier. The distributor 66 distributes the amplified high-frequency signal to a plurality of high-frequency signals and outputs them to the transistors Q2 and Q3. The transistor Q2 is a main amplifier and amplifies one of the high-frequency signals distributed by the distributor 66. The transistor Q3 is a peak amplifier and amplifies the other of the high-frequency signals distributed by the distributor 66. The combiner 67 combines the high-frequency signal amplified by the transistor Q2 and the high-frequency signal amplified by the transistor Q3, and outputs the combined high-frequency signal to the output terminal Tout. The high-frequency signal input to the input terminal Tin and output from the output terminal Tout is, for example, a signal of 0.5 GHz to 100 GHz, and typically a signal of 0.5 GHz to 10 GHz.

The transistor Q2 performs class A or class B operation, and transistor Q3 performs class C operation. When the input power is small, the transistor Q2 mainly amplifies the input signal. When the input power increases, the peak of the input signal is amplified by the transistor Q3 in addition to the transistor Q2. Thus, the transistors Q2 and Q3 amplify the input signal. When the input power is small and the transistor Q3 does not operate, the impedance seen from the transistor Q2 to the combiner 67 is twice a load R of the output terminal Tout (for example, 2×50Ω). When the input power is large and the transistor Q3 operates, each of the impedance seen from the transistor Q2 to the combiner 67 and the impedance seen from the transistor Q3 to the combiner 67 is the load R (for example, 50Ω). The matching circuits 62 and 64 are adjusted so that the transistor Q2 operates optimally at the saturated output in the load 2R when the transistor Q3 does not operate, while the matching circuits 62 and 64 are adjusted so that the transistor Q2 operates optimally at the saturated output in the load R when the transistor Q3 operates. The matching circuits 63 and 65 are adjusted so that the impedance viewed from the combiner 67 to the transistor Q3 opens when the transistor Q3 does not operate, while the matching circuits 63 and 65 are adjusted so that the transistor Q3 operates optimally at the saturated output in the load R when the transistor Q3 operates.

At least one of transistors Q1 to Q3 may be provided on the chip 20a or 20b with the pillars 16a or 16b, and at least one of the matching circuits 60 to 65 may be provided on chip 22a with no pillars. The input terminal Tin, the output terminal Tout, and the bias terminals Tg1 to Tg3 and Td1 to Td3 can be the terminal 10a.

In a first comparative example, the chips 20a and 20b are connected to the metal layer 18 by using the through electrodes 14c instead of using the pillars 16a and 16b. When the through holes 15c are formed using the laser beam 13c as illustrated in FIG. 9A, the widths Wb3 (see FIG. 4) of the through electrode 14c are made smaller than the widths Wa1 (see FIG. 5) of the electrodes 21a and 21b of the chips 20a and 20b. For example, when the widths Wa1 are 100 μm, the widths Wb3 are set to 80 μm in consideration of the margin. It is difficult to make the widths Wb3 100 μm or less using a laser beam.

Figure 12:
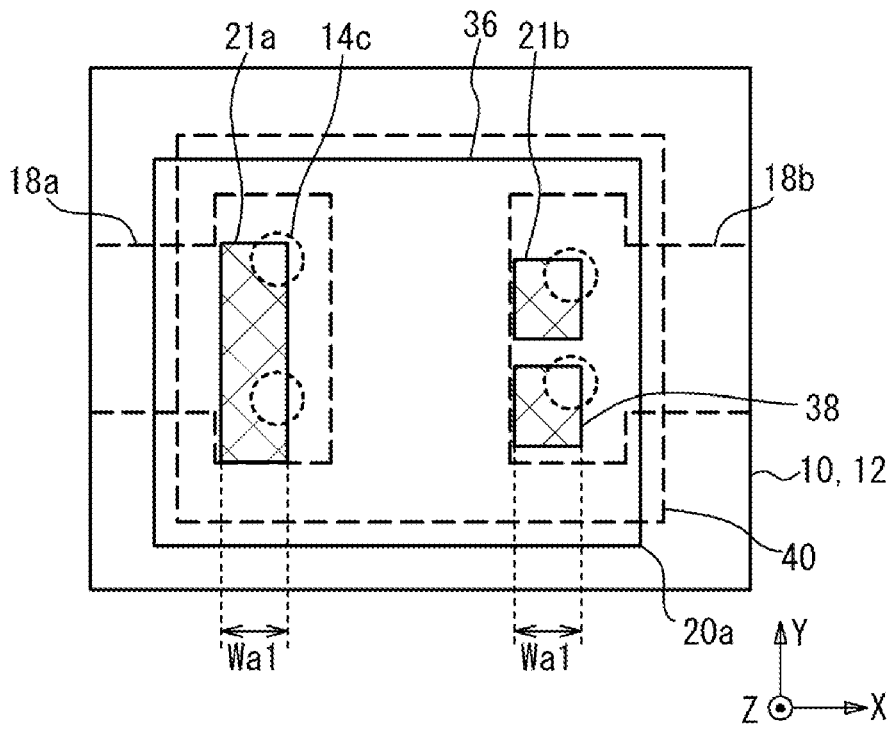
FIG. 12 is a plan view of the vicinity of the chip 20a according to a first comparative example.

Even when the widths Wb3 of the through electrodes 14c can be set to 80 there is a problem of alignment accuracy. FIG. 12 is a plan view of the vicinity of the chip 20a according to the first comparative example. As illustrated in FIG. 12, a target mounting position 40, which is a target position for mounting the chip 20a on the metal base 10, is illustrated by a broken line. The alignment accuracy for mounting the chip 20a on the metal base 10 is 15 to 25 μm. Therefore, the mounting position of the chip 20a may be shifted from the target mounting position 40. As a result, the through electrode 14c protrudes from the electrodes 21a and 21b. It is conceivable to widen the widths Wa1 of the electrodes 21a and 21b. However, when the cost per unit area of the chips 20a and 20b is high (for example, the cost per unit area of the GaN HEMT is high), the cost is increased by increasing the widths Wa1.

Figure 13:
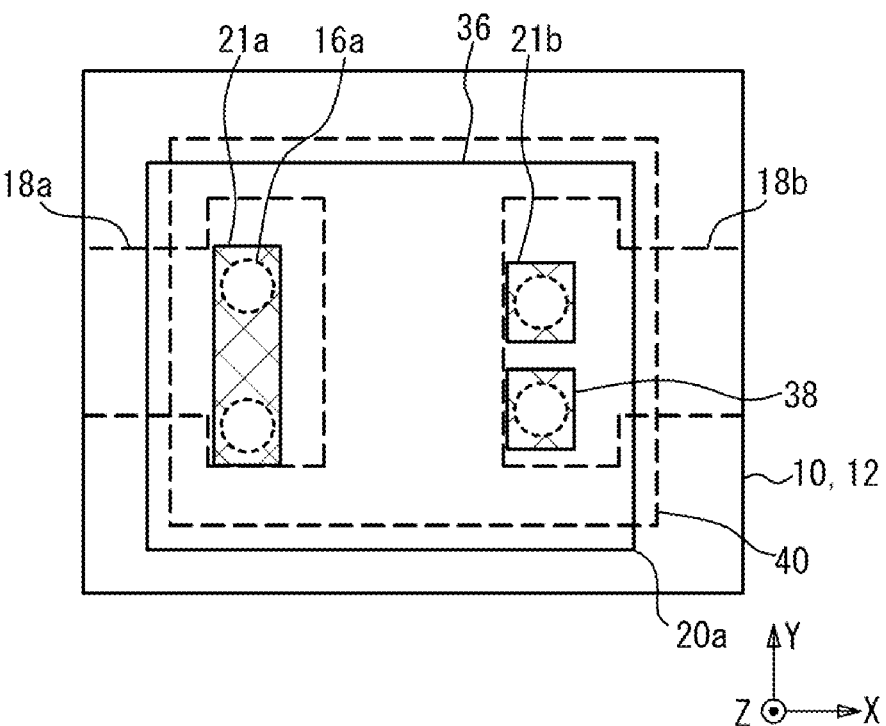
FIG. 13 is a plan view of the vicinity of the chip 20a according to the first embodiment.

FIG. 13 is a plan view of the vicinity of the chip 20a according to the first embodiment. As illustrated in FIG. 13, in the first embodiment, the chip 20a is provided with the pillars 16a. Since the pillars 16a are formed by using a semiconductor manufacturing process, the alignment accuracy between the pillars 16a and the electrodes 21a and 21b is 10 μm or less, and the pillars 16a hardly deviate from the electrodes 21a and 21b. Therefore, even when the mounting position of the chip 20a deviates from the target mounting position 40, the pillars 16a do not detach from the electrodes 21a and 21b. If the wirings 18a and 18b are formed large, the pillars 16a do not detach from the wirings 18a and 18b. Therefore, the electrodes 21a and 21b of the semiconductor chip 20a need not be increased in size, and the cost of the semiconductor chip 20a can be suppressed.

Figure 7B:
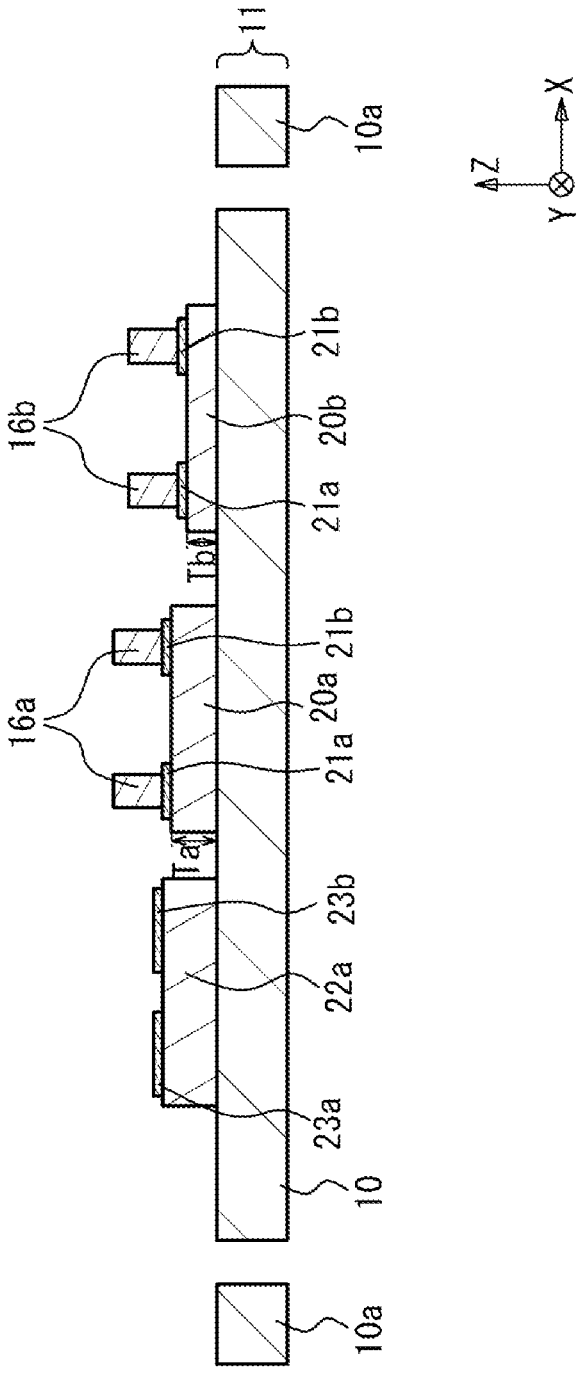
FIG. 7B is a cross-sectional view illustrating a method of manufacturing the high-frequency device according to the first embodiment.

According to the first embodiment, as illustrated in FIG. 7B, the chip 20a (first chip) having the pillars 16a (first pillar) provided on its upper surface is mounted on the metal base 10. As illustrated in FIG. 8A, the insulator layer 12 covering the semiconductor chip 20a is formed on the metal base 10. As illustrated in FIG. 8B, the upper surfaces of the pillars 16a are exposed from the insulator layer 12. Wirings 18a and 18b (first wiring) which are connected to the pillars 16a and transmit the high-frequency signals are formed on the insulator layer 12. Thus, as compared with the first comparative example, even when the mounting position of the semiconductor chip 20a deviates from the target mounting position 40 as illustrated in FIG. 13, the pillars 16a can be prevented from being detached from the electrodes 21a and 21b. Therefore, it is not necessary to increase the size of the chip 20a, and the manufacturing cost of the high-frequency device can be suppressed. Although the chip 20a has been described as the semiconductor chip, the chip 20a may be other than the semiconductor chip if the cost of providing the pillars 16a is less than the cost of increasing the size of the chip 20a.

As illustrated in FIG. 7B, the chip 22a (second chip) is mounted on the metal base 10. As illustrated in FIG. 8A, in the step of forming the insulator layer 12, the insulator layer 12 covering the chips 20a and 22a is formed. As illustrated in FIG. 9A, the through holes 15c (first through hole) reaching the upper surface of the chip 22a are formed in the insulator layer 12. As illustrated in FIG. 9B, the through electrodes 14c (first through electrode) connected to the upper surface of the chip 22a are formed in the through holes 15c. As illustrated in FIG. 10A, the wirings 18c and 18d (second wiring) connected to the through electrodes 14c are formed on the insulator layer 12. When the cost per unit area of the chip 22a is low, the manufacturing cost can be reduced by increasing the size of the electrodes 23a and 23b rather than providing the pillars. When the areas of the electrodes 23a and 23b are large, forming the pillars on the chip 22a increases the manufacturing cost of the chip 22a. In these cases, it is preferable to provide the through electrodes 14c without providing the pillars on the chip 22a.

As illustrated in FIGS. 3 and 4, the chip 22a is a passive element having the dielectric substrate 30 and the electrodes 23a and 23b provided on the upper surface of the dielectric substrate 30. In this case, the areas of the electrodes 23a and 23b are large. Moreover, the manufacturing cost per unit area of the passive element is lower than that of the semiconductor chip. Therefore, it is preferable that the through electrodes 14c are provided on the chip 22a without providing the pillars.

As illustrated in FIGS. 5 and 6, the chip 20a includes the transistor Q1. Since the chip 20a in which the transistor Q1 is formed has a high manufacturing cost per unit area, the areas of the electrodes 21a and 21b are small. Therefore, it is preferable to provide the pillars 16a on the chip 20a.

As illustrated in FIG. 2, the passive element provided on the chip 22a is at least a part of the matching circuit connected to the transistor Q1 provided on the chip 20a. Thus, the cost of the high-frequency device including the transistor Q1 and the matching circuit can be reduced.

As illustrated in FIGS. 3 to 6, the chip 20a includes the electrodes 21a and 21b (first electrodes) to which the pillars 16a are bonded. The chip 22a includes the electrodes 23a and 23b (second electrode) to which the through electrodes 14c are bonded. The widths Wb1 of the electrodes 23a and 23b are larger than the widths Wa1 of the electrodes 21a and 21b. Since the minimum widths Wa1 of the electrodes 21a and 21b can be reduced, the manufacturing cost of the chip 20a can be suppressed. Since no pillar is provided for the chip 22a having large minimum widths Wb1 of the electrodes 23a and 23b, the manufacturing cost of the chip 22a can be suppressed.

As illustrated in FIG. 9A, in the step of forming the through holes 15c, the through holes 15c are formed by irradiating the insulating layer 12 with the laser beam 13c. When the through holes 15c are formed using the laser beam 13c, the through holes 15c become large. Therefore, it is preferable to provide the through electrodes 14c on the chip 22a provided with the electrodes 23a and 23b having large widths.

As illustrated in FIG. 7B, the chip 20b (third chip) having the pillars 16b (second pillar) provided on its upper surface is mounted on the metal base 10. As illustrated in FIG. 8A, in the step of forming the insulator layer 12, the insulator layer 12 covering the chips 20a and 20b is formed. As illustrated in FIG. 8B, the upper surfaces of the pillars 16a and 16b are exposed from the upper surface of the insulator layer 12 by polishing or grinding the insulator layer 12 covering the pillars 16a and 16b. As illustrated in FIG. 10A, the wirings 18e and 18f (third wiring) connected to the pillars 16b are formed on the insulator layer 12. Thus, as illustrated in FIG. 10A, the metal layer 18 can be brought into contact with the pillars 16a and 16b even when the heights (positions in the Z direction) of the upper surfaces of the pillars 16a and 16b are different from each other as illustrated in FIG. 7B. As an example in which the heights of the upper surfaces of the pillars 16a and 16b are different, an example in which the thicknesses Ta and Tb of the chips 20a and 20b are different has been described. The pillars 16a and 16b may have different heights due to differences in manufacturing processes or manufacturing errors.

As illustrated in FIG. 9A, the through hole 15a (second through hole) reaching the upper surface of the metal base 10 is formed in the insulator layer 12. As illustrated in FIG. 9B, the through electrode 14a (second through electrode) connected to the upper surface of the metal base 10 is formed in the through hole 15a. As illustrated in FIG. 10A, the wiring 18g (fourth wiring) connected to the through electrode 14a is formed on the insulator layer 12. Thus, the wiring 18g connected to the metal base 10 and supplied with the ground potential can be provided on the insulator layer 12.

As illustrated in FIG. 10B, the electronic components 24 are mounted on the metal layer 18 provided on the insulator layer 12. Thus, the electronic components 24 can be mounted without increasing the size of the high-frequency device.

First Modification of First Embodiment

Figure 14A:
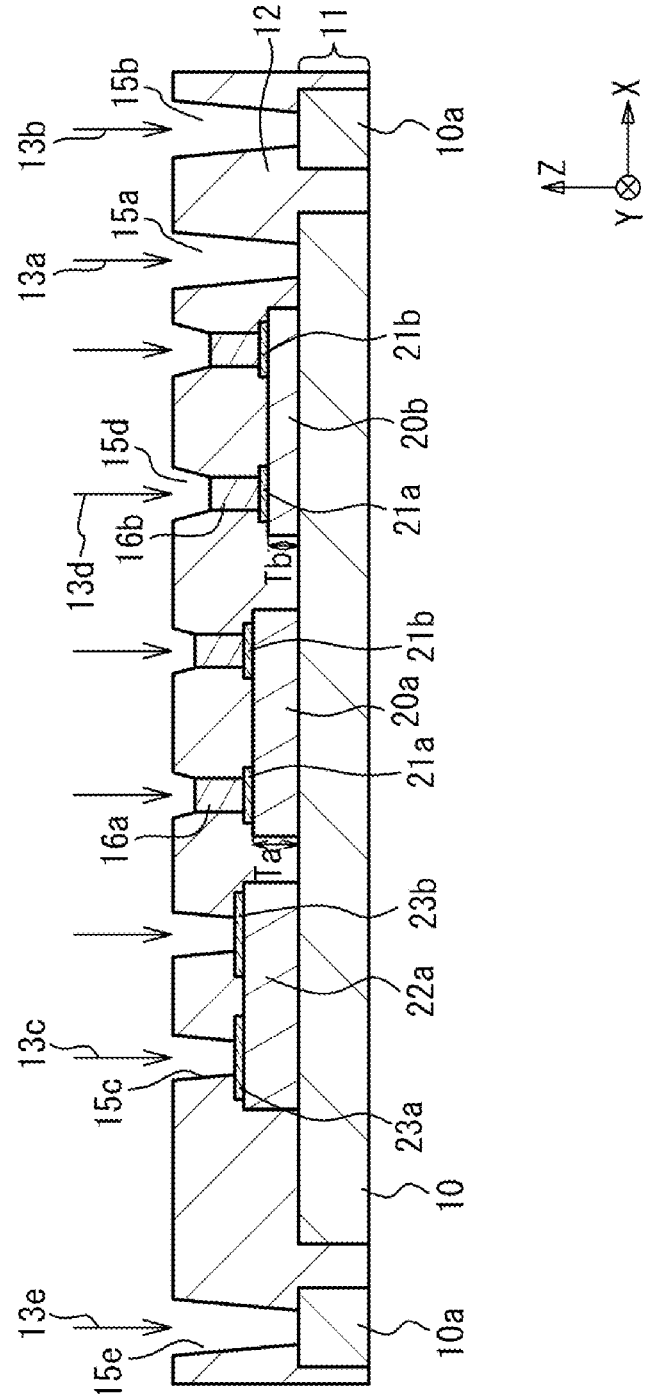
FIG. 14A is a cross-sectional view illustrating a method of manufacturing a high-frequency device according to a first modification of the first embodiment.

FIGS. 14A to 15B are cross-sectional views illustrating a method of manufacturing a high-frequency device according to a first modification of the first embodiment. As illustrated in FIG. 14A, when the through holes 15a to 15c and 15e are formed without polishing the upper surface of the insulator layer 12 as illustrated in FIG. 8B of the first embodiment, the through holes 15d that expose the upper surfaces of the pillars 16a and 16b are formed using a laser beam 13d. The through holes 15d do not reach the upper surfaces of the chips 20a and 20b.

Figure 14B:
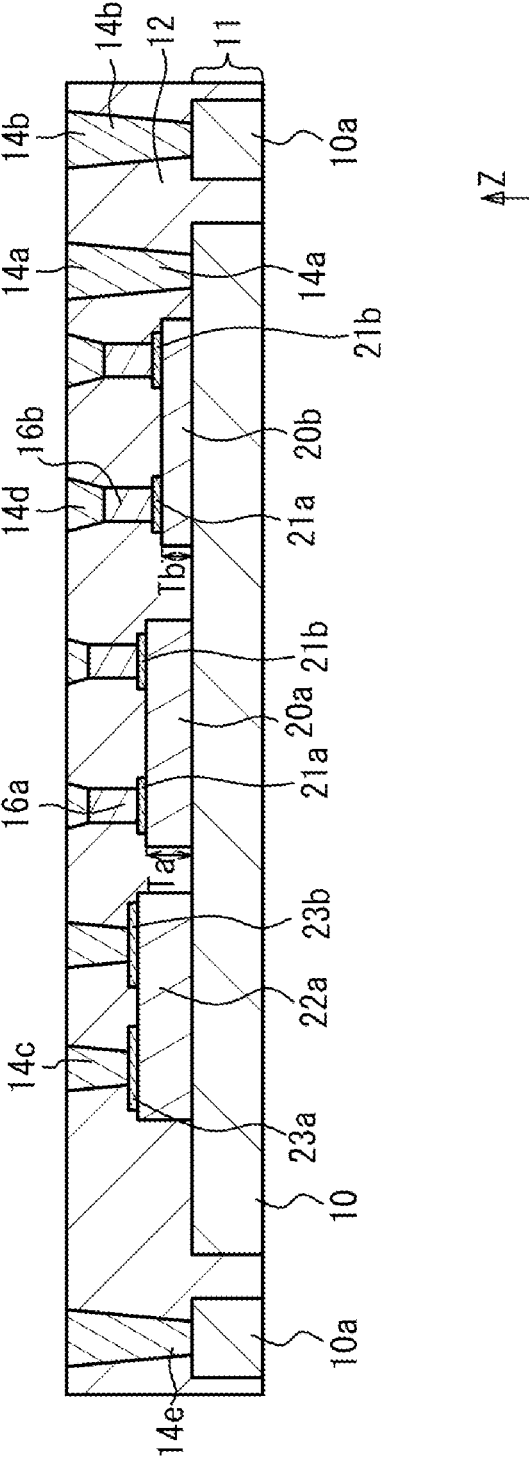
FIG. 14B is a cross-sectional view illustrating a method of manufacturing the high-frequency device according to the first modification of the first embodiment.

As illustrated in FIG. 14B, when through electrodes are formed in the through holes 15d, through electrodes 14d connected to the pillars 16a and 16b are formed. The through electrodes 14d do not reach the upper surfaces of the chips 20a and 20b.

Figure 15A:
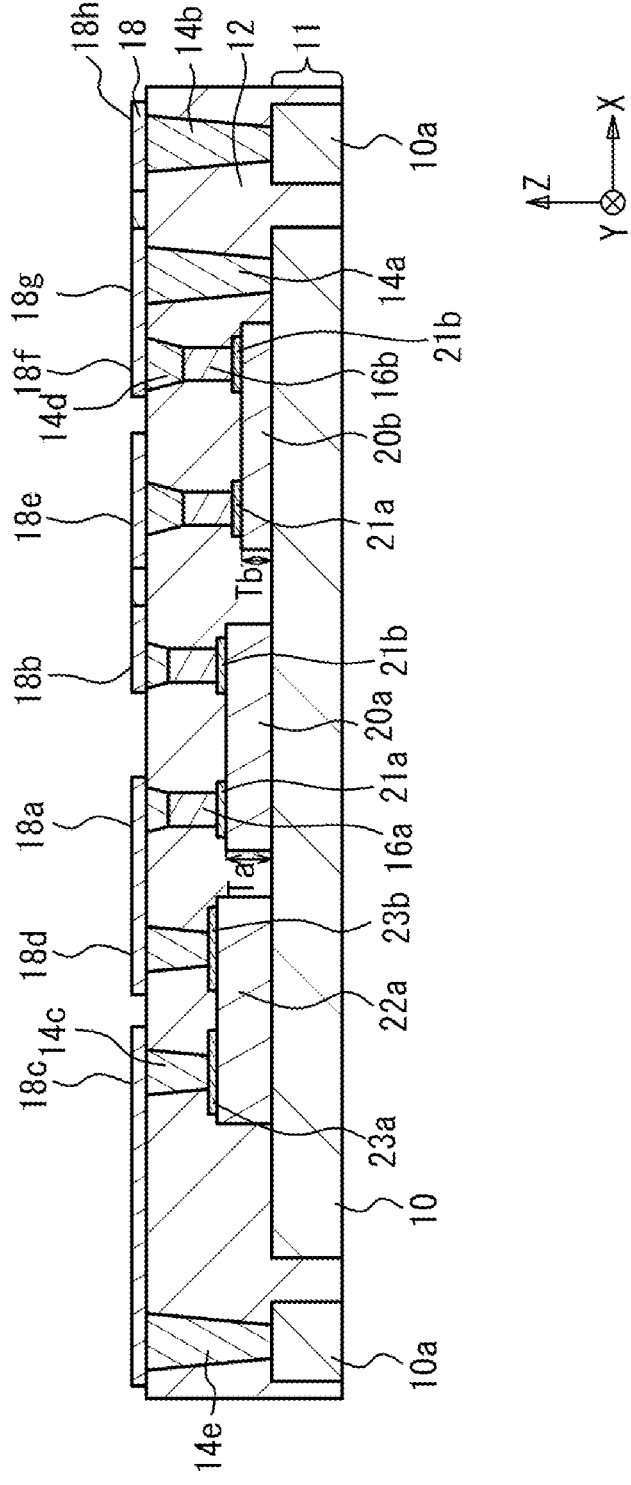
FIG. 15A is a cross-sectional view illustrating a method of manufacturing the high-frequency device according to a first modification of the first embodiment.

As illustrated in FIG. 15A, when the metal layer 18 is formed, a part of the metal layer 18 is formed so as to be connected to the through electrodes 14d. Thus, the wirings 18a, 18b, 18e and 18f connected to the chips 20a and 20b via the through electrodes 14d and the pillars 16a and 16b can be formed.

Figure 15B:
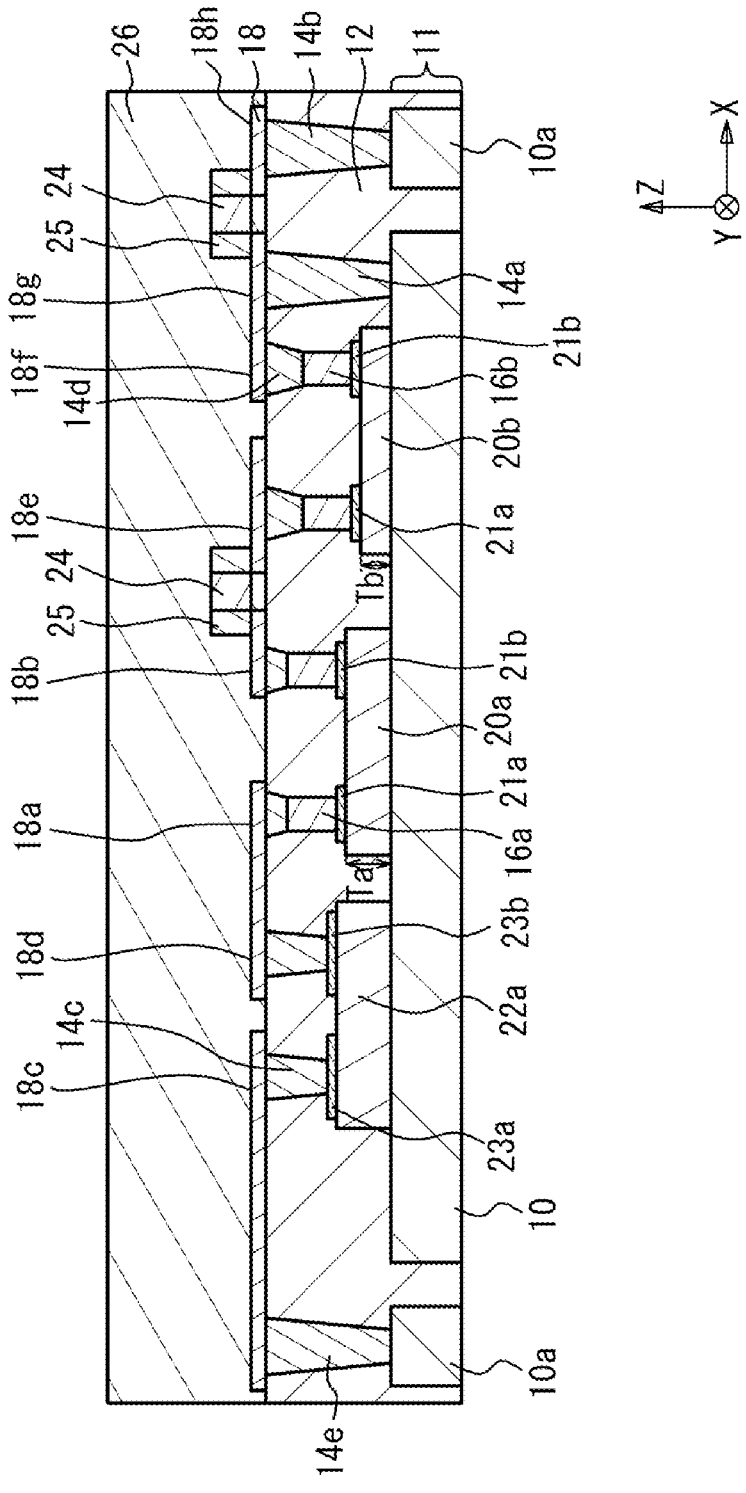
FIG. 15B is a cross-sectional view illustrating a method of manufacturing the high-frequency device according to the first modification of the first embodiment.

As illustrated in FIG. 15B, by mounting the electronic components 24 and forming the insulator layer 26, the high-frequency device according to the first modification of the first embodiment can be manufactured. Other steps are the same as those in the first embodiment, and description thereof is omitted.

In the step of exposing the upper surfaces of the pillars 16a and 16b from the insulator layer 12 as in the first modification of the first embodiment, the upper surfaces of the pillars 16a and 16b may be exposed from the insulator layer 12 through the through holes 15d as illustrated in FIG. 14A. In the step of forming the wiring (metal layer 18) connected to the pillars 16a and 16b on the insulator layer 12, the pillars 16a and 16b may be connected to the metal layer 18 via the through electrodes 14d. Also in the first modification of the first embodiment, if the widths of the through holed 15d are made sufficiently large, the pillars 16a and 16b can be electrically connected to the metal layer 18 even if the mounting position of the chips 20a and 20b deviates from the target mounting position 40.

Second Modification of First Embodiment

Figure 16A:
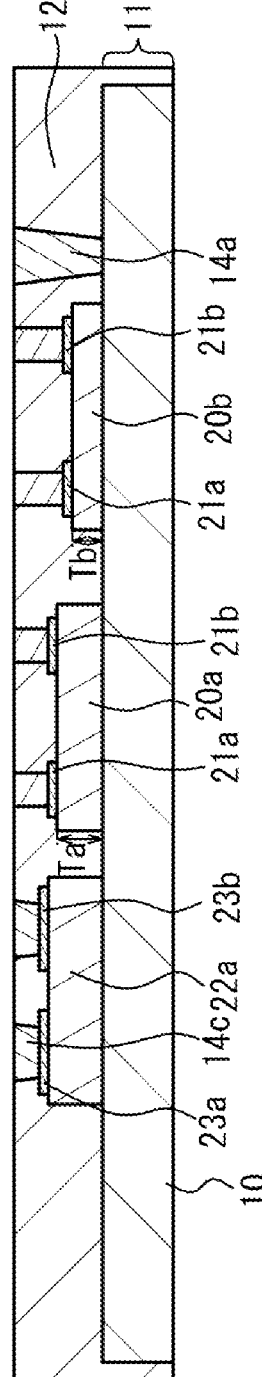
FIG. 16A is a cross-sectional view illustrating a method of manufacturing a high-frequency device according to a second modification of the first embodiment.
Figure 16A:
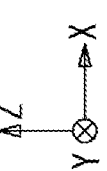
Figure 16B:
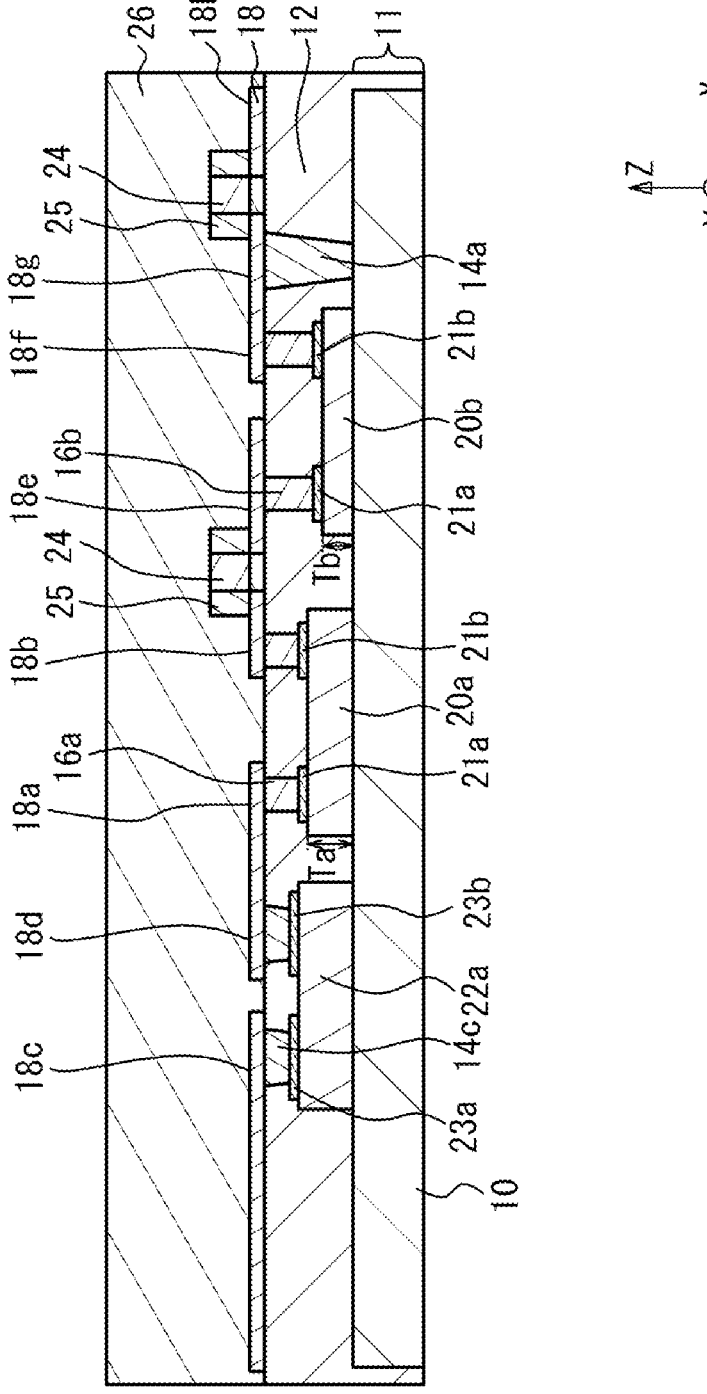
FIG. 16B is a cross-sectional view illustrating a method of manufacturing the high-frequency device according to the second modification of the first embodiment.

FIGS. 16A to 16B are cross-sectional views illustrating a method of manufacturing a high-frequency device according to a second modification of the first embodiment. As illustrated in FIG. 16A, the terminals 10a and the through electrodes 14b and 14e as illustrated in FIG. 9B of the first embodiment are not provided. As illustrated in FIG. 16B, the metal layer 18 is formed, the electronic components 24 are mounted thereon, and the insulator layer 26 is formed.

Figure 17A:
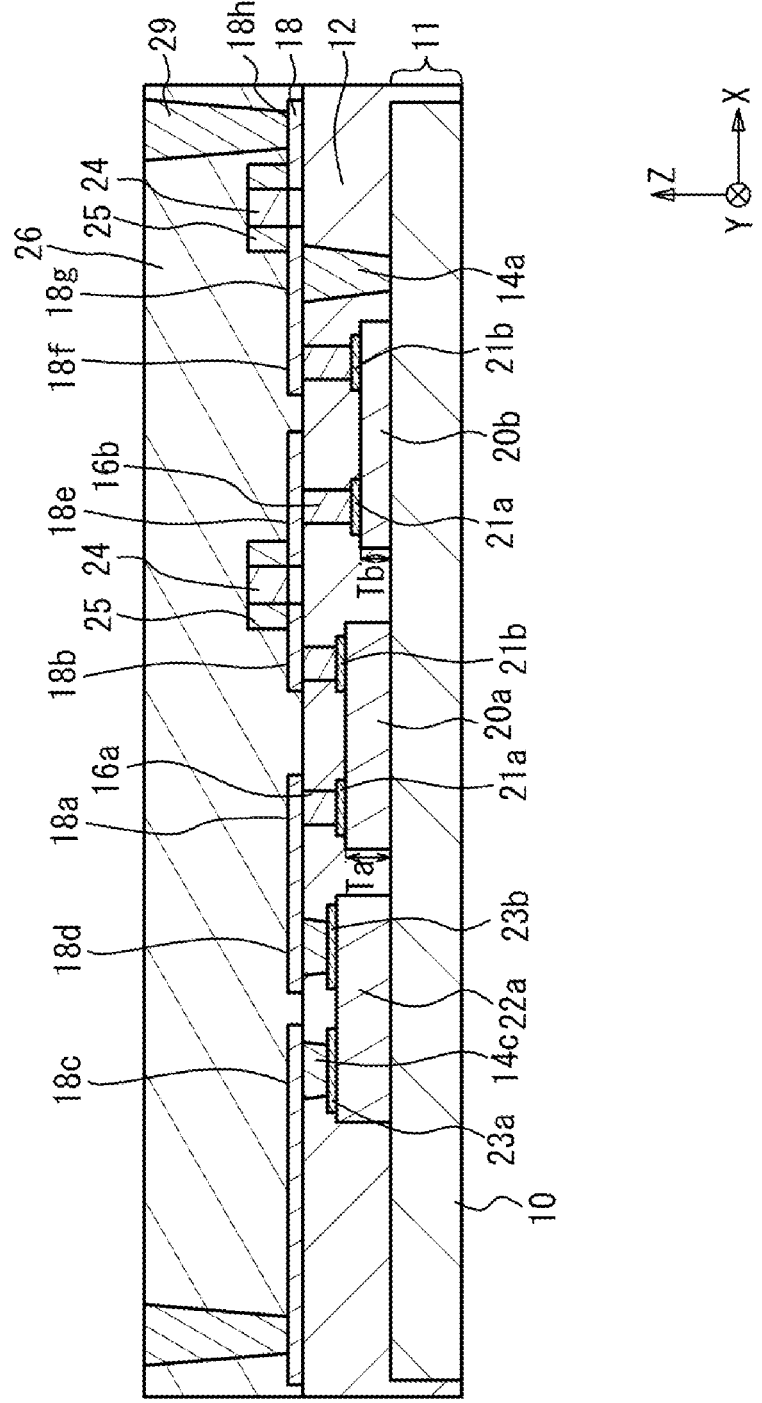
FIG. 17A is a cross-sectional view illustrating a method of manufacturing the high-frequency device according to the second modification of the first embodiment.
Figure 17B:
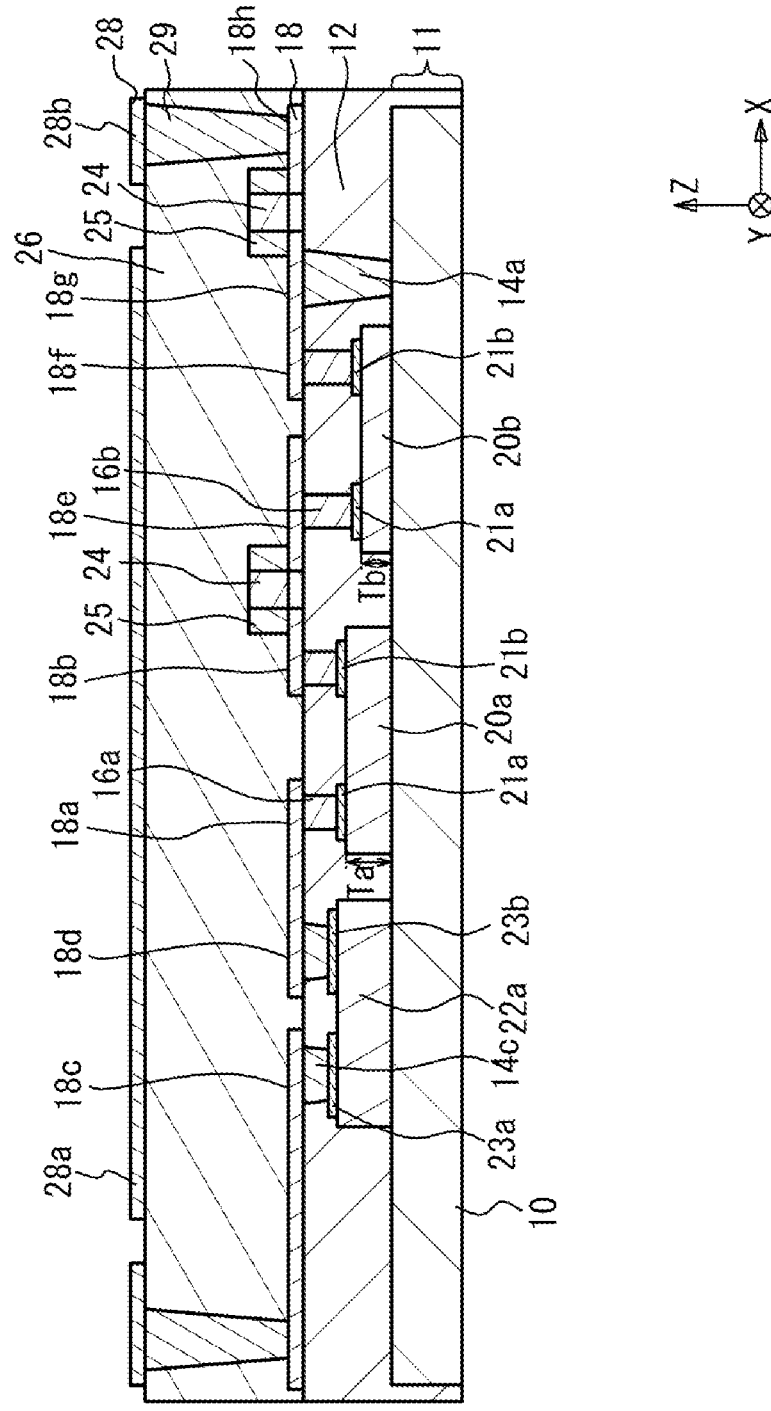
FIG. 17B is a cross-sectional view illustrating a method of manufacturing the high-frequency device according to the second modification of the first embodiment.

As illustrated in FIG. 17A, through electrodes 29 are formed through the insulator layer 26 and connected to the metal layer 18. The through electrodes 29 are formed by forming through holes penetrating through the insulator layer 26 and reaching the upper surface of the metal layer 18, and forming the through electrodes 29 in the through holes, similarly to the through electrodes 14b and 14e of the first embodiment. As illustrated in FIG. 17B, a metal layer 28 is formed on the insulator layer 26. The metal layer 28 forms a shield layer 28a and terminals 28b. Thus, the high-frequency device according to the second modification of the first embodiment can be manufactured. Other steps are the same as those in the first embodiment, and description thereof is omitted.

As in the second modification of the first embodiment, the terminals 28b may be provided on the upper surface of the insulator layer 26. The shield layer 28a may be provided on the upper surface of the insulator layer 26. By supplying the ground potential to the metal base 10 and the shield layer 28a, the upper and lower surfaces of the high-frequency device can be shielded.

In the first embodiment and the modifications thereof, an amplifying apparatus has been described as an example of the high-frequency apparatus, but the high-frequency apparatus may be other than the amplifying apparatus. Although the Docherty amplifier has been described as an example of the amplifying apparatus, an amplifying apparatus other than the Docherty amplifier may be used. The high-frequency device may be provided with one or a plurality of passive elements, or with one or a plurality of semiconductor chips.

The embodiments disclosed here should be considered illustrative in all respects and not restrictive. The present disclosure is not limited to the specific embodiments described above, but various variations and changes are possible within the scope of the gist of the present disclosure as described in the claims.

What is claimed is:

1. A method of manufacturing a high-frequency device, comprising:
   mounting a first chip having a first pillar on an upper surface thereof on a metal base;
   mounting a second chip on the metal base;
   forming an insulator layer covering the first chip and the second chip on the metal base;
   forming, in the insulator layer, a pillar through hole that exposes an upper surface of the first pillar without reaching an upper surface of the first chip;
   forming a pillar through electrode in the pillar through hole that is electrically connected to the upper surface of the first pillar;
   forming a first wiring on the insulator layer that is connected to the pillar through electrode, the first wiring and the metal base defining a microstrip line configured to transmit a high-frequency signal, the metal base being supplied with a ground potential;
   forming a chip through hole reaching an upper surface of the second chip in the insulator layer;
   forming a chip through electrode connected to an upper surface of the second chip in the chip through hole; and
   forming a second wiring on the insulator layer, the second wiring being connected to the chip through electrode.

2. The method of manufacturing the high-frequency device according to claim 1,
   wherein the second chip is a passive element including a dielectric substrate and an electrode provided on an upper surface of the dielectric substrate.

3. The method of manufacturing the high-frequency device according to claim 2,
   wherein the first chip includes a transistor.

4. The method of manufacturing the high-frequency device according to claim 3,
   wherein the passive element is at least a part of a matching circuit connected to the transistor.

5. The method of manufacturing the high-frequency device according to claim 1,
   wherein the first chip includes a first electrode to which the first pillar is bonded,
   the second chip includes a second electrode to which the chip through electrode is bonded, and
   a width of the second electrode is larger than that of the first electrode.

6. The method of manufacturing the high-frequency device according to claim 1,
   wherein the forming the chip through hole includes forming the chip through hole by irradiating the insulating layer with a laser beam.

7. The method of manufacturing the high-frequency device according to claim 1, further comprising:
   mounting a third chip having a second pillar on an upper surface thereof on the metal base; and
   forming a third wiring connected to the second pillar on the insulator layer;
   wherein the forming the insulator layer includes forming the insulator layer covering the first chip, the second chip, and the third chip, and
   the exposing the upper surface of the first pillar from the insulator layer includes exposing the upper surfaces of the first pillar and the second pillar from the upper surface of the insulator layer by polishing or grinding the insulator layer covering the first pillar and the second pillar.

8. The method of manufacturing the high-frequency device according to claim 1, further comprising:
   forming a second through hole reaching an upper surface of the metal base in the insulator layer;
   forming a second through electrode connected to the upper surface of the metal base in the second through hole; and
   forming a fourth wiring connected to the second through electrode on the insulator layer.

9. The method of manufacturing the high-frequency device according to claim 1, further comprising:
   mounting an electronic component on a metal layer provided on the insulator layer.

\* \* \* \* \*